(12) United States Patent
Van Zyl

(10) Patent No.: US 11,705,822 B2
(45) Date of Patent: Jul. 18, 2023

(54) VOLTAGE CLAMP AND CURRENT CLAMP SYSTEMS WITH POWER RECOVERY

(71) Applicant: Advanced Energy Industries, Inc., Fort Collins, CO (US)

(72) Inventor: Gideon Van Zyl, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 100 days.

(21) Appl. No.: 17/229,858

(22) Filed: Apr. 13, 2021

(65) Prior Publication Data

US 2022/0329170 A1 Oct. 13, 2022

(51) Int. Cl.
*H02M 3/335* (2006.01)
*H02M 1/32* (2007.01)
*H01J 37/32* (2006.01)

(52) U.S. Cl.
CPC ... *H02M 3/33592* (2013.01); *H01J 37/32183* (2013.01); *H02M 1/32* (2013.01)

(58) Field of Classification Search
CPC .......................... H02M 3/33592; H02M 1/32
See application file for complete search history.

(56) References Cited

U.S. PATENT DOCUMENTS

| | | | | |
|---|---|---|---|---|
| 5,606,284 A * | 2/1997 | Tamesue | ............... | H03G 3/3026 330/135 |
| 8,929,107 B2 * | 1/2015 | Kang | ..................... | H02H 7/125 361/118 |
| 9,019,669 B1 | 4/2015 | Ransijn | | |
| 10,148,188 B2 | 12/2018 | Koo et al. | | |
| 10,587,206 B1 | 3/2020 | Xiao et al. | | |
| 2006/0139823 A1 * | 6/2006 | Shoji | ....................... | H02M 1/34 361/56 |
| 2007/0035408 A1 * | 2/2007 | Roberts | ................... | H03F 1/327 340/815.45 |
| 2008/0074909 A1 | 3/2008 | Mehta | | |
| 2010/0283395 A1 | 11/2010 | Van Zyl et al. | | |

(Continued)

FOREIGN PATENT DOCUMENTS

| | | |
|---|---|---|
| EP | 3514907 A1 | 7/2019 |
| JP | 2021035205 A | 3/2021 |

(Continued)

OTHER PUBLICATIONS

Rodriquez, Kari, "International Search Report and Written Opinion Regarding International Application No. PCT/US21/27081", dated Jul. 27, 2021, p. 19, Published in: US.

(Continued)

*Primary Examiner* — Sisay G Tiku
(74) *Attorney, Agent, or Firm* — Neugeboren O'Dowd PC

(57) ABSTRACT

Various embodiments are directed to a voltage clamp system comprising: a rectifier; a protected node, a reference node, and one or more internal nodes, coupled to the rectifier; a power converter, coupled to the rectifier via the one or more internal nodes; and one or more output nodes coupled to the power converter and configured to couple to a power sink. The rectifier and the power converter are configured to output power via one or more output nodes coupled to the rectifier, and to limit a component of the voltage between the protected node and the reference node.

20 Claims, 30 Drawing Sheets

(56) References Cited

U.S. PATENT DOCUMENTS

| | | | |
|---|---|---|---|
| 2011/0101898 A1 | 5/2011 | Shinomoto et al. | |
| 2012/0235504 A1 | 9/2012 | Kesler et al. | |
| 2014/0210508 A1 | 7/2014 | Valcore, Jr. et al. | |
| 2015/0263511 A1 | 9/2015 | Sandner et al. | |
| 2016/0380425 A1* | 12/2016 | Chapman | H02M 3/33573 |
| | | | 363/21.01 |
| 2018/0006448 A1 | 1/2018 | Glaser et al. | |
| 2019/0131940 A1 | 5/2019 | Moise et al. | |
| 2019/0273496 A1* | 9/2019 | van Zyl | H03K 17/74 |
| 2021/0320594 A1 | 10/2021 | Van Zyl | |
| 2022/0329169 A1 | 10/2022 | van Zyl | |
| 2022/0329170 A1 | 10/2022 | van Zyl | |

FOREIGN PATENT DOCUMENTS

| | | | | |
|---|---|---|---|---|
| WO | WO-2010013344 A1 * | 2/2010 | | H02M 1/126 |
| WO | WO-2010064284 A1 * | 6/2010 | | H02M 1/4225 |
| WO | 2021211582 A1 | 10/2021 | | |
| WO | WO-2022155837 A1 * | 7/2022 | | |

OTHER PUBLICATIONS

ISA/KR, "International Search Report and Written Opinion Regarding International Application No. PCT/US2022/020515", dated Jul. 14, 2022, p. 9, Published in: KR.

Jang, Gi Jeong, "International Search Report and Written Opinion Regarding Application No. PCT/US2022/053313", dated May 3, 2022, p. 10, Published in: KR.

* cited by examiner

VOLTAGE CLAMP AND CURRENT CLAMP SYSTEMS WITH POWER RECOVERY

TECHNICAL FIELD

Aspects of the present disclosure relates generally to power supplies and impedance matching networks, and more specifically to power supplies and impedance matching networks for applying power to plasma processing systems.

BACKGROUND

Power supplies and impedance matching networks that apply power to plasma systems such as radio frequency (RF) generators and impedance matching networks, direct current (DC) supplies, and alternating current (AC) supplies are frequently subject to damaging events such as sudden changes in the load impedance presented by the plasma system, arcing, and unstable plasma systems. Damage caused by overvoltage events generally happen much more quickly than control systems are able to react to, as opposed to damage caused by high dissipation and high current events where the thermal capacity of the components provide some ability to absorb the impact of the event until the control system can react. In some cases, for example, overcurrent in silicon carbide devices, overcurrent events can also cause damage more quickly than the reaction time of many control systems. Circuits that clamp voltage and current can temporarily protect sensitive circuits and systems from overvoltage and overcurrent, but in the process of doing so, the voltage or current clamp absorbs power from the circuit, typically limiting the length of time the clamp can perform the clamping function.

SUMMARY

Various embodiments disclosed herein provide voltage and current clamps that can clamp voltage and current at a pre-determined level for an extended time, among other advantages.

Various aspects are directed to a voltage clamp system comprising: a rectifier; a protected node, a reference node, and one or more internal nodes, coupled to the rectifier; a power converter, coupled to the rectifier via the one or more internal nodes; and one or more output nodes coupled to the power converter and configured to couple to a power sink. The rectifier and the power converter are configured to output power via one or more output nodes coupled to the rectifier, and to limit a component of the voltage between the protected node and the reference node.

Various aspects are directed to a voltage clamping method comprising: configuring a power converter, coupled to a rectifier via one or more internal nodes, to output power via one or more output nodes to a power sink; and configuring the power converter and the rectifier to limit a component of a voltage between a protected node and a reference node coupled to the rectifier.

Various aspects are directed to a voltage clamp with power recovery for multiple series connected switches. Such series switch voltage clamps may each include a plurality of switches, each having a first and second node connected in series between a high voltage node and a low voltage node. The first node of the first switch is connected to the high voltage node, the first node of each successive switch of the plurality of switches is connected to a second node of a preceding switch of the plurality of switches, and a second node of the last switch is connected to the low voltage node. Each of these stacked switch circuits further includes a plurality of capacitors, each associated with one of the switches. Each of these stacked switch circuits further includes a plurality of rectifiers, wherein each respective rectifier among the plurality of rectifiers is associated with a respective switch of the plurality of switches, wherein each rectifier connects two nodes of the respective switch to a respective capacitor of the plurality of capacitors, associated with the switch, in such a way that a voltage difference between the two nodes of the respective switch is limited to a sum of a capacitor voltage of the respective capacitor and a rectifier voltage drop of the respective rectifier. Each of these stacked switch circuits further includes a power converter. Each of these stacked switch circuits further includes a circuit comprising at least one diode, wherein the power converter is coupled to the capacitors with the circuit, and directly or indirectly to at least one of the high voltage node and low voltage node. Each of these stacked switch circuits further includes one or more output nodes, coupled to the power converter and configured to couple to a power sink, wherein the circuit and the power converter are configured to reduce the voltages of the capacitors associated with the switches below a clamping voltage when the switches are closed, by outputting power via the one or more output nodes Various further aspects are depicted in the accompanying figures and described below, and will be further apparent based thereon.

BRIEF DESCRIPTION OF THE DRAWINGS

Various features and advantages of the technology of the present disclosure will be apparent from the following description of particular embodiments of those technologies, and as illustrated in the accompanying drawings. The drawings are not necessarily to scale; the emphasis instead is placed on illustrating the principles of the technological concepts. In the drawings, like reference characters may refer to the same parts throughout the different views. The drawings depict only illustrative embodiments of the present disclosure and, therefore, are not to be considered limiting in scope.

FIG. 10 illustrates a block diagram of an example voltage clamp with power recovery, coupled to a protected device and a power sink, according to an embodiment of the present disclosure.

DETAILED DESCRIPTION

Embodiments of the present disclosure may provide voltage clamping and/or current clamping circuits with power recovery, such as for clamping voltages between protected and reference nodes, and limiting current in protected branches in circuits, respectively. By recovering power to a power sink, which may be, e.g., a DC bus or an AC utility power supply to a building, the clamping circuits can operate in a clamping mode for extended time periods, unlike clamping circuits that dissipate power to perform a clamping function. Power recovery also improves overall system efficiency. A power converter that maintains a constant input voltage or input current for voltage clamping circuits or current clamping circuits, respectively, allows for control over the level at which voltage or current is clamped, and accepts power from the clamping circuit and directs it to a power sink while the clamping operation is active.

In some embodiments, circuits for clamping the voltage over each of multiple devices stacked in series, and using a special arrangement of diodes to direct current to the input of a single converter, allows for a single power converter to recover power to a power sink while clamping the voltages over each individual device in the stack.

In some embodiments, circuits for clamping the current through each of multiple devices in parallel and using a special arrangement of diodes to direct current to a single power converter allows for a single power converter to recover power to a power sink while clamping the currents through each individual device connected in parallel.

In some embodiments, voltage clamps can be used to, e.g., limit the maximum voltage over a protected device, such as a metal-oxide semiconductor field effect transistor (MOSFET) used in a power amplifier, or a capacitor or PIN diode in a solid state match. In some embodiments and applications, there may be no protected device between the protected and reference nodes that the voltage clamp is limiting, but limiting voltage between those specific nodes may provide useful functions such as limiting impedance excursions or voltage and current elsewhere in a circuit, among other advantageous functions.

In some embodiments, current clamps may be used, e.g., to enforce a maximum current through a device such as an inductor or the drain current of a MOSFET. In some embodiments and applications, there may be no protected device in the current branch that the current clamp is limiting, but limiting the current in that specific branch, as noted above with reference to voltage clamp embodiments, may provide useful functions such as limiting impedance excursions or voltage and current elsewhere in a circuit, among other advantageous functions.

Figure 1A:
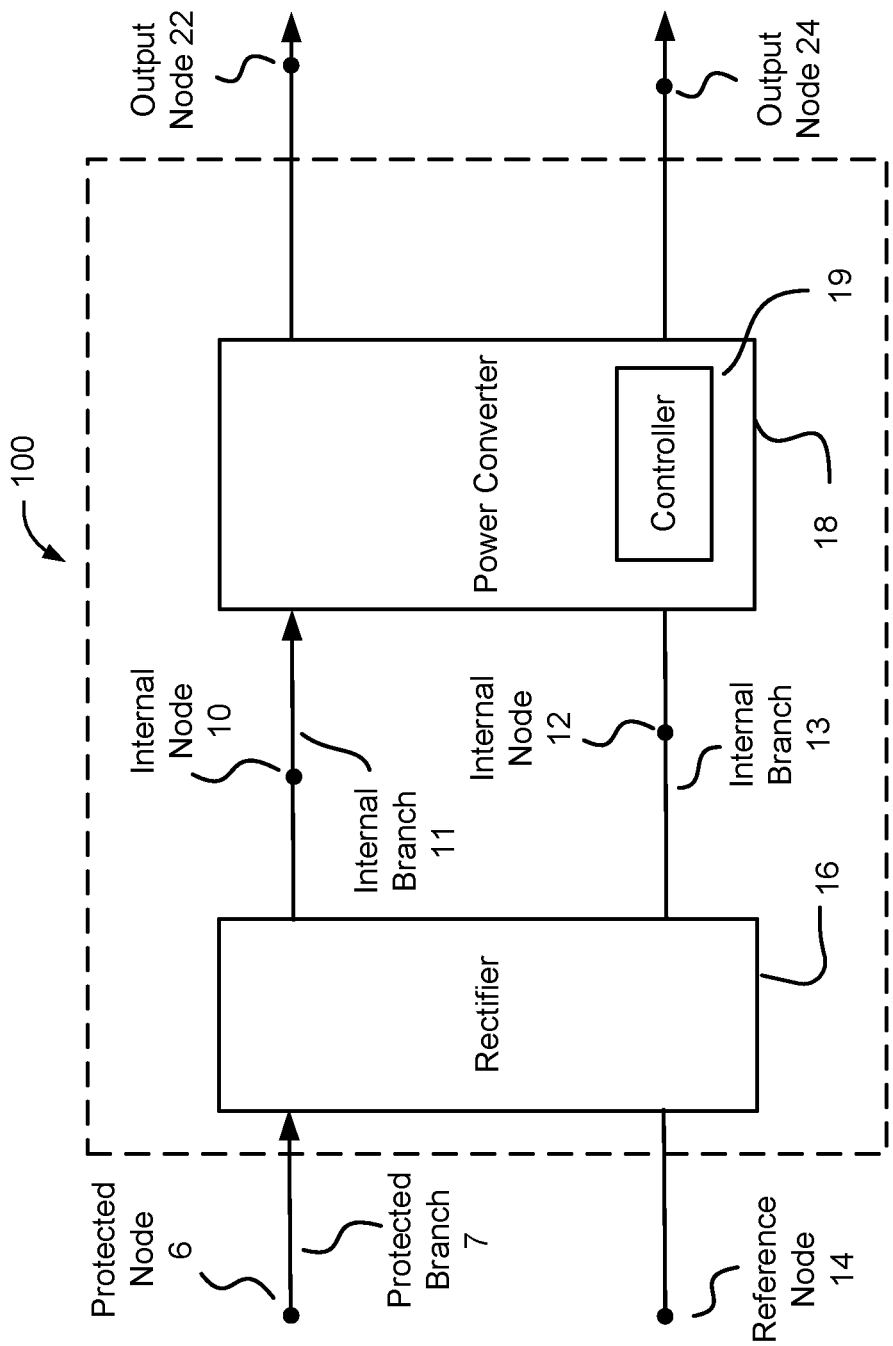
FIG. 1A illustrates a block diagram of an example clamp with power recovery, according to an embodiment of the present disclosure.

FIG. 1A depicts a block diagram of an example power recovery clamp 100, in accordance with one embodiment. Power recovery clamp 100 may function as a voltage clamp or a current clamp, in various embodiments. Power recovery clamp 100 includes a rectifier 16 and a power converter 18, coupled to each other via internal nodes 10 and 12. Rectifier 16 is coupled to a protected node 6 configured to connected to an external protected device, and a reference node 14. Power converter 18 is coupled to output nodes 22, 24, and is configured to connect thereby to a power sink. Rectifier 16 is configured to connect with a protected device via protected node 6, and thereby to provide voltage clamping or current clamping to the protected device, while providing power recovery via output nodes 22 and 24. These functions for both voltage clamp and current clamp embodiments are explained further below, with reference to a number of additional embodiments.

Figure 1B:
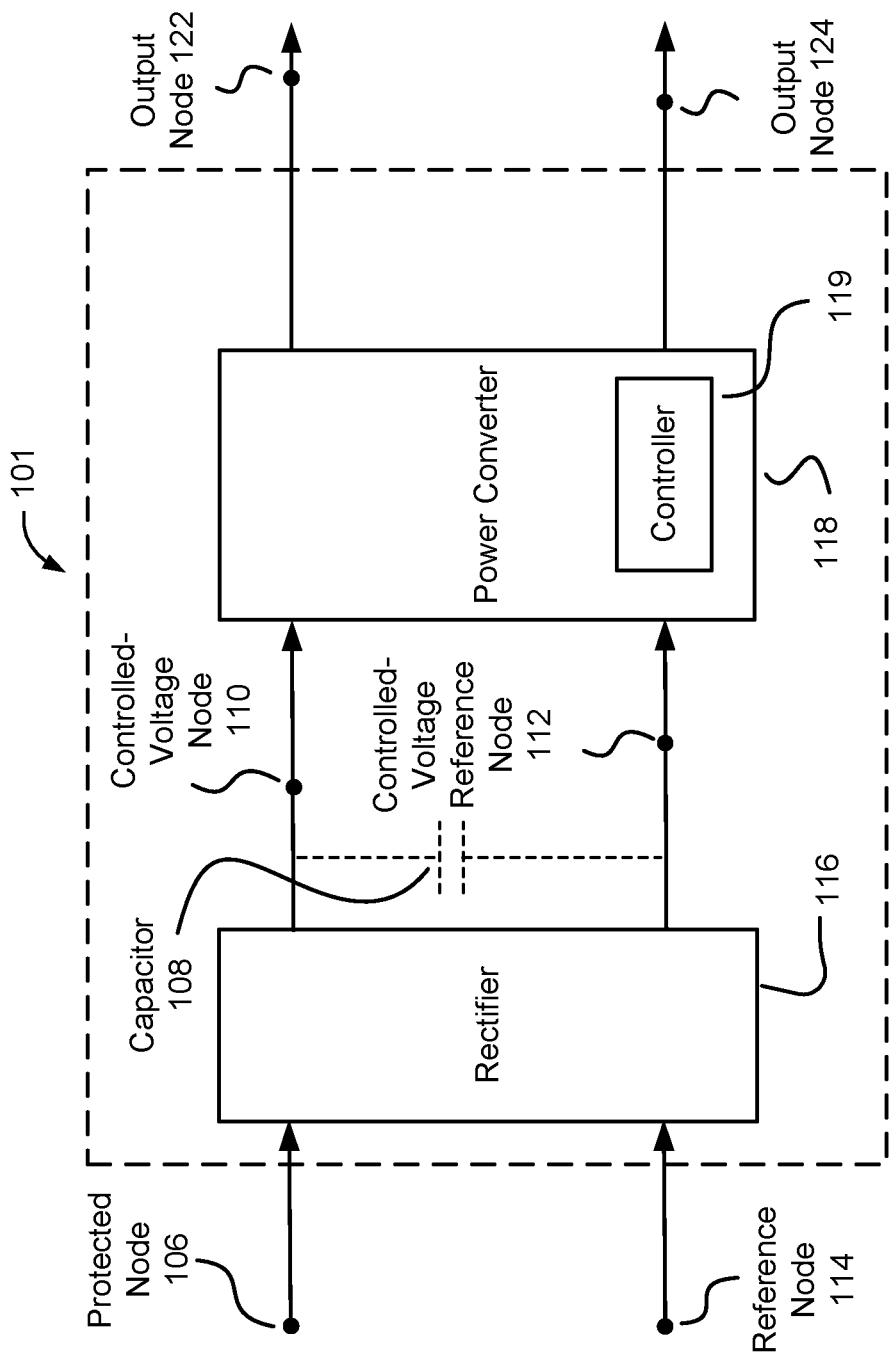
FIG. 1B illustrates a block diagram of an example voltage clamp with power recovery according to an embodiment of the present disclosure.

FIG. 1B illustrates a block diagram of an example power recovery voltage clamp 101, according to one embodiment of the present disclosure. That is, power recovery voltage clamp 101 ("voltage clamp 101") is a voltage clamp that provides power recovery. Voltage clamp 101 has a protected node 106 and a reference node 114, and two output nodes 122, 124. Voltage clamp 101 includes a rectifier 116, a power converter 118, and a capacitor 108. Power converter 118 is coupled to rectifier 116 via a controlled-voltage node 110 and a controlled-voltage reference node 112. Capacitor 108 is coupled between controlled-voltage node 110 and a controlled-voltage reference node 112. Rectifier 116 is coupled to protected node 106 and a reference node 114, and power converter 118 is coupled to output nodes 122 and 124.

Voltage clamp 101 may be configured to connect protected node 106 and reference node 114 to a power sink (not shown in FIG. 1B) via output nodes 122 and 124. Voltage clamp 101 may be configured to connect to a protected device (not shown in FIG. 1B) via protected node 106 and reference node 114 and to limit a component of a voltage between the protected node 106 and reference node 114 by diverting power via output nodes 122 and 124 to a power sink. In various embodiments, the power sink may be external to voltage clamp 101. In other embodiments, a voltage clamp may include a power sink (not shown in FIG. 1B). Rectifier 116 thus connects protected node 106 and reference node 114 to the input of power converter 118. The power converter 118 is configured to maintain a constant voltage over the input nodes of the power converter by directing power to a power sink.

Figure 1C:
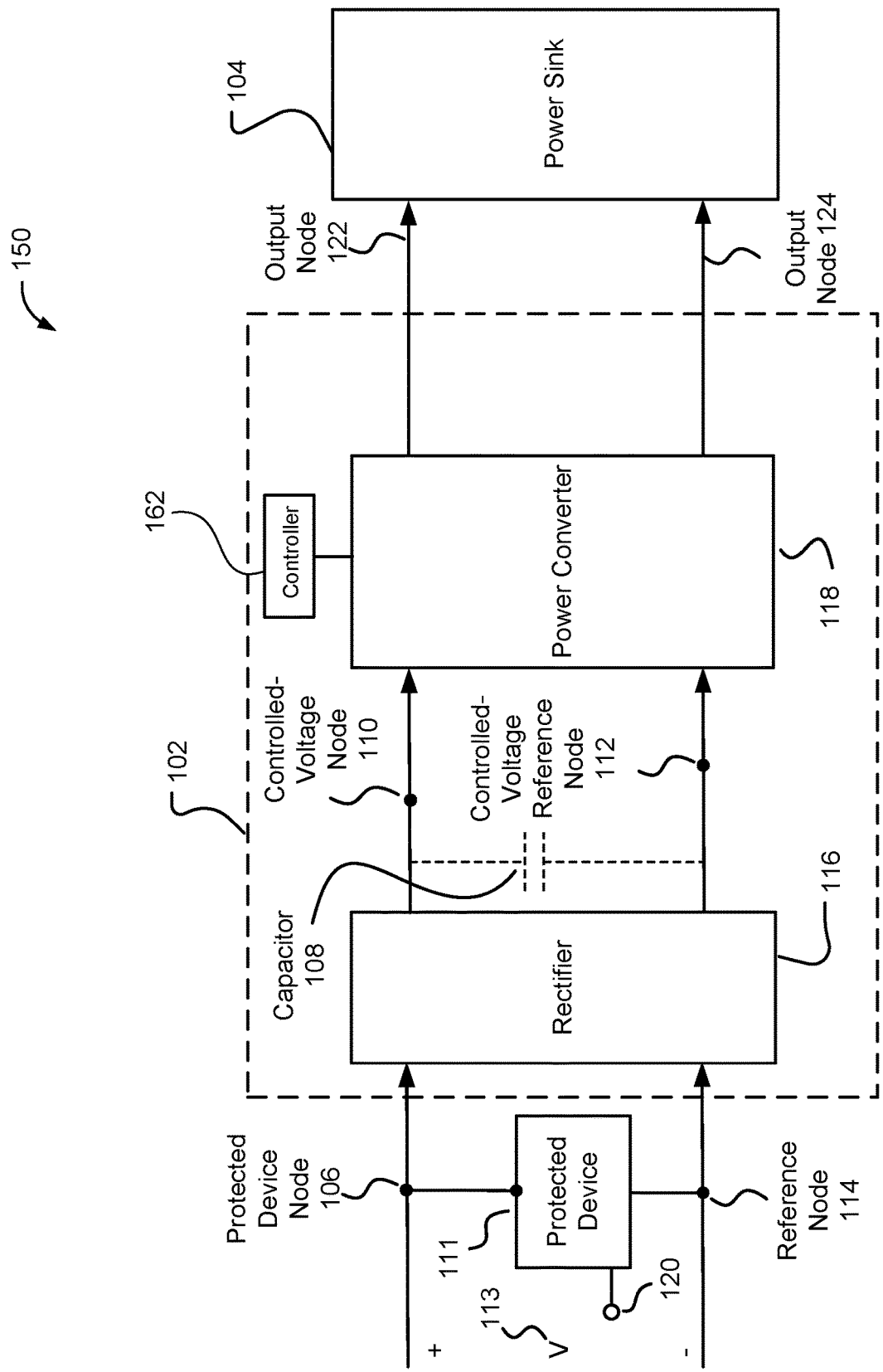

FIG. 1C illustrates a block diagram of an example power recovery voltage clamp 102 installed in an example power recovery voltage clamp system 150 according to an embodiment of the present disclosure. The voltage clamp 102 connects protected node 106 and reference node 114 of voltage clamp 102 to a power sink 104. The voltage clamp 102 limits a component of a voltage V 113 between the protected node 106 and reference node 114, including by diverting power to the power sink 104. As described above, rectifier 116 connects the protected node 106 and reference node 114 to the input of power converter 118. Protected node 106 and reference node 114 may be considered indirectly connected to the input of power converter 118, in that they are connected through rectifier 116, rather than being directly connected to each other. Power converter 118 maintains a constant voltage over the input nodes of the power converter, i.e., controlled-voltage node 110 and controlled-voltage reference node 112, by directing power to power sink 104, as needed to maintain that constant voltage over input nodes 110, 112. In some examples, a controller 162 is connected to power converter 118 and executes control processes or methods to direct the function of power converter 118. Any of the functions or effects of power converter 118 may be performed, executed, or embodied by controller 162, in various embodiments. The power sink 104 may be, e.g., a DC rail in a power amplifier, or an AC utility supply. In the embodiment of FIG. 1C, power recovery voltage clamp 102 also includes a capacitor 108, connected between the power converter input nodes, i.e., controlled-voltage node 110 and controlled-voltage reference node 112. In this embodiment, capacitor 108 may help maintain the voltage between the controlled voltage node 110 and controlled voltage reference node 112. In various other embodiments, depending on the design of power converter 118 and the distance between the rectifier 116 and power converter 118, a power recovery voltage clamp of this disclosure may not include a capacitor between controlled-voltage node 110 and controlled-voltage reference node 112 (as in the embodiment of FIG. 1A).

Not all the nodes need to be distinct nodes. In some embodiments of the power recovery voltage clamp, the reference node 114 and controlled voltage reference node 112 may both be embodied in a single node. Terminals of a protected device 111 may connect to the protected node 106 and reference node 114. These terminals may be, e.g., the drain and source or gate and source terminals of a MOSFET device. The protected device may have other terminals, e.g. terminal 120. The design of the rectifier 116 and the power converter 118 may help determine which component of the voltage between the protected node 106 and reference node 114 will be limited, of a number of various voltage components that may be limited. The limited voltage component may, for example, be the maximum voltage value, the minimum voltage value, the absolute value of voltage, the maximum of the low frequency component of the voltage, the absolute value of the high frequency component of the voltage, etc.

In some embodiments, voltage clamp 102 may be provided by itself, with no protected device attached, and ready to connect to a protected device. In other embodiments, voltage clamp 102 may include protected device 111 attached thereto. In various embodiments, voltage clamp 102 may be packaged together with protected device 111, or one or more components of voltage clamp 102 may be packaged together with protected device 111. For example, rectifier 116 and protected device 111 may be packaged together. In another example, protected device 111, rectifier 116, and capacitor 108 may be packaged together. Various components, such as protected device 111, rectifier 116, and capacitor 108, may be packaged together on a substrate, such as a ceramic substrate.

Figure 2A:
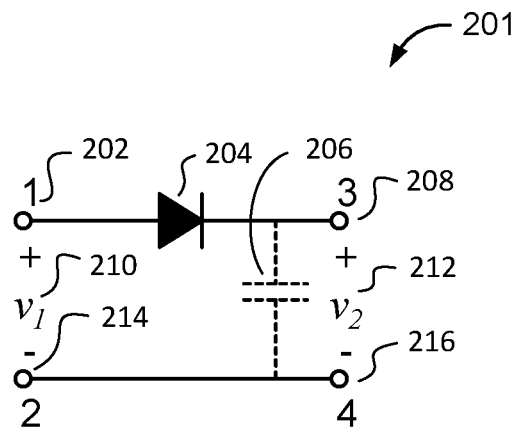
FIGS. 2A-2J illustrate various example rectifier circuits that can be used in connection with a voltage clamp with power recovery in various embodiments of the present disclosure.

FIGS. 2A through 2J show various rectifiers which may be example embodiments of rectifier 116 in FIGS. 1A-1C, and rectifier sub-circuits that may embody components of rectifier 116, which may be used as part of or in connection with a voltage clamp with power recovery in various embodiments of the present disclosure. In the description that follows, various elements may be referred to both with a circuit diagram identifier and a patent reference number, e.g., voltage v1, 210, and node 1, 202. It will be understood that references to nodes 1-4 or voltages v1 and v2 refer to their own separate respective elements (e.g., nodes, voltages) across the different figures. FIG. 2A shows a rectifier 201 capable of limiting a voltage v1, 210, to a maximum value of a voltage v2, 212, plus the voltage of one diode voltage drop across diode 204, typically between 0.4 and 1.2 volt. In some cases, the diode 204 may be replaced by multiple diodes in series, which may help enable withstanding higher voltages when the diode is in the off state. In those cases, the effective diode voltage drop increases. In FIG. 2A, node 1, 202, may embody the protected node 106 of FIGS. 1A-1C; node 2, 214, may embody the reference node 114 of FIGS. 1A-1C; node 3, 208, may embody the controlled voltage node 110 of FIG. 1; and node 4, 216, may embody the controlled voltage reference node 112 of FIGS. 1A-1C. The same holds for nodes 1 through 4 of example rectifiers 221, 231, 241, 251, 261, respectively, of FIG. 2B through FIG. 2F. That is, rectifiers 221, 231, 241, 251, 261 are each example embodiments of rectifier 116 of FIGS. 1A-1C; and in each, nodes 1-4 may embody protected node 106, reference node 114, controlled voltage node 110, and controlled voltage reference node 112, respectively, of FIGS. 1A-1C. Note that for the rectifier 201 of FIG. 2A, the reference node 2, 214, and controlled voltage reference node 4, 216, are the same node—that is, they are directly connected by a conductive line. This is also true for the rectifier 221 of FIG. 2B, in which reference node 2 and controlled voltage reference node 4 are the same node, i.e., directly connected by a conductive line. In other embodiments, such as for the rectifiers 231, 241, 251, 261 of FIGS. 2C-2F, reference node 2 and controlled voltage reference node 4 are separate nodes.

The rectifier 201 of FIG. 2A contains a single diode 204, or multiple series connected diodes acting like a single diode with a higher effective diode voltage drop, and depicted in FIG. 2A as a single diode 204. While rectifier 201 is depicted in FIG. 2A as including capacitor 206, which corresponds to the optional capacitor 108 of FIG. 1, in other embodiments otherwise conforming to FIG. 2A, a rectifier may omit a capacitor such as capacitor 206, and may not include a capacitor.

Figure 2B:
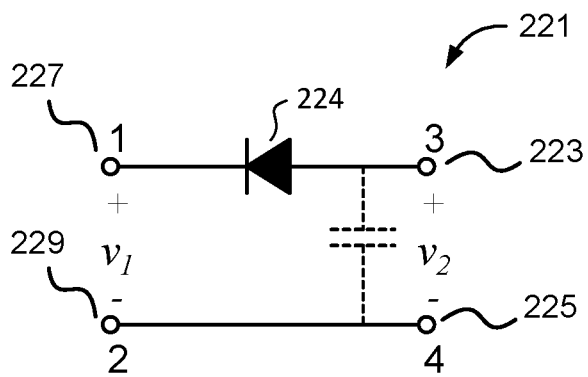
Figure 2C:
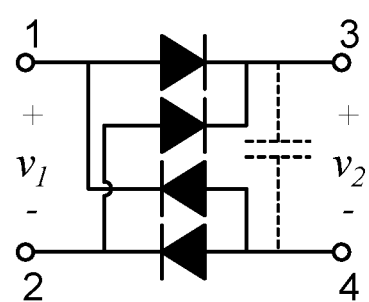
Figure 2D:
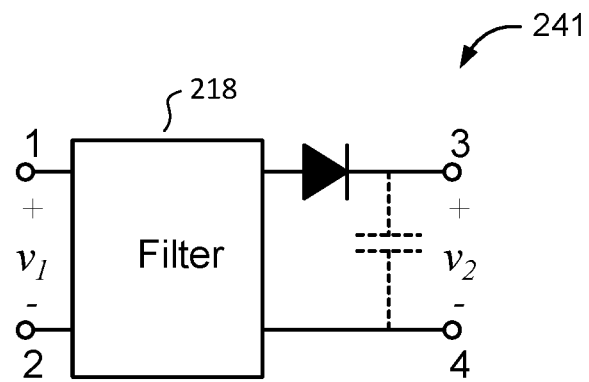
Figure 2E:
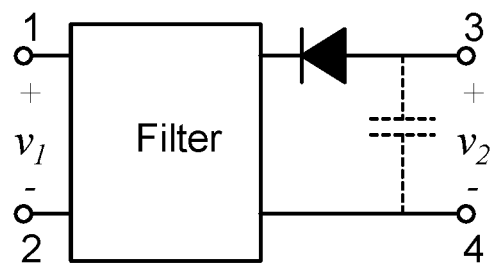
Figure 2F:
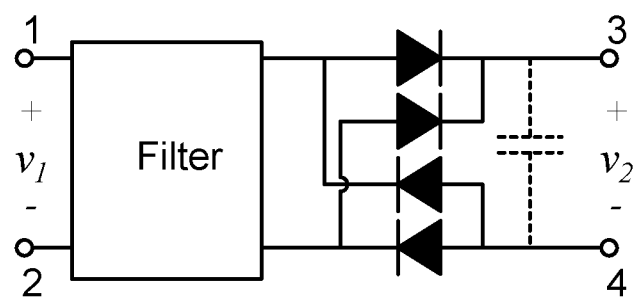
Figure 2G:
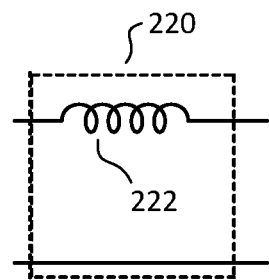
Figure 2H:
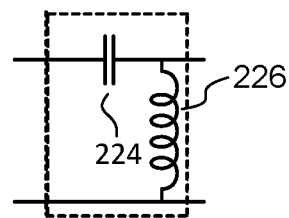
Figure 2I:
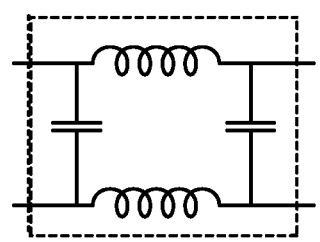
Figure 2J:
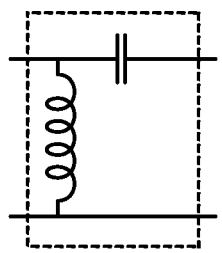

Rectifier 221 of FIG. 2B has a first voltage v1 across protected node 1, 227, and reference node 2, 229, and a second voltage v2 across controlled voltage node 3, 223, and controlled voltage reference node 4, 225. The rectifier 221 of FIG. 2B limits the value of voltage v1 to a minimum of voltage v2 minus the voltage difference of one diode voltage drop, corresponding to the voltage drop across diode 224. The rectifier 231 of FIG. 2C limits the amplitude of the voltage v1 (across protected node 1 and reference node 2) to the voltage v2 (across controlled voltage node 3 and controlled voltage reference node 4) plus two diode voltage drops. Each of the rectifiers 201, 221, 231, shown in FIG. 2A through 2C, respectively, may be combined with filters (e.g., filter 218 of FIG. 2D), as shown in rectifiers 241, 251, 261 of FIG. 2D through 2F, to further select, determine, or embody components of the voltage v1 as shown in FIG. 2D through 2F. A few illustrative embodiment topologies for the filters of FIGS. 2D-2F (e.g., filter 218) are shown in FIG. 2G through 2K. The filter 220 of FIG. 2G contains a single inductor 222 and selects the DC component of the voltage v1. Using the filter of FIG. 2G in the rectifier of FIG. 2D would, for example, limit the low frequency or DC component of voltage v1 to voltage v2 plus one diode voltage drop, but would allow the AC or RF component of voltage v1 to go above the limit set by the voltage clamp. The filter of FIG. 2H contains a single capacitor 224 and inductor 226 and selects the high frequency, AC, or RF component of voltage v1. Using the filter of FIG. 2H in the rectifier of FIG. 2F would, for example, limit the high frequency, AC, or RF component of voltage v1 to voltage v2 plus two diode voltage drops, but would not limit the DC or low frequency component of v1. The filters 2G and 2H, with proper choice of the components, would not likely load the circuit in which the voltage clamp is used, i.e., if the voltage v1 is not in the range in which it is being clamped, the voltage clamp does not alter the behavior of the circuit substantially. The filters of FIGS. 2I and 2J do load the circuit in which the clamp is used. For example, in embodiments of a voltage clamp system of any of FIGS. 1A-1C incorporating a rectifier of FIG. 2I or 2J, with a protected node and a reference node as described and depicted with reference to those embodiments, the circuit of FIG. 2I creates a low impedance between the protected node and the reference node at high frequency, and the circuit of FIG. 2J creates a low impedance between the protected node and reference node at low frequency.

Figure 3A:
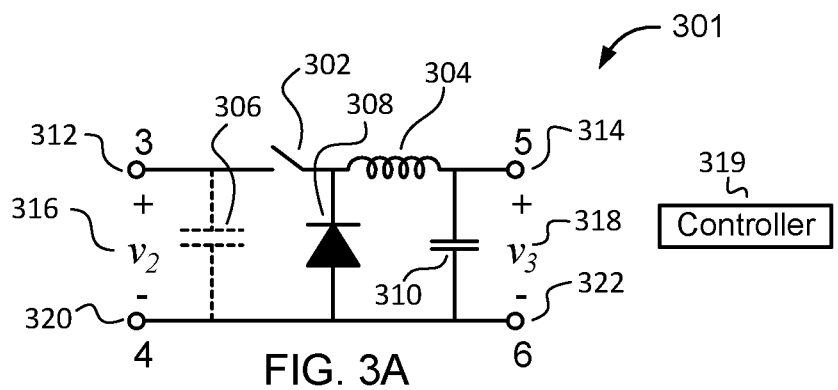
FIGS. 3A-3F illustrate various example power converters that can be used in connection with a voltage clamp with power recovery in various embodiments of the present disclosure.
Figure 3B:
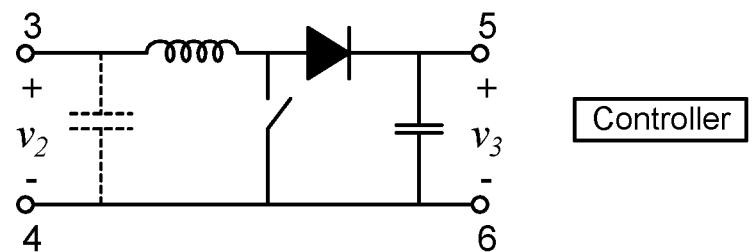
Figure 3C:
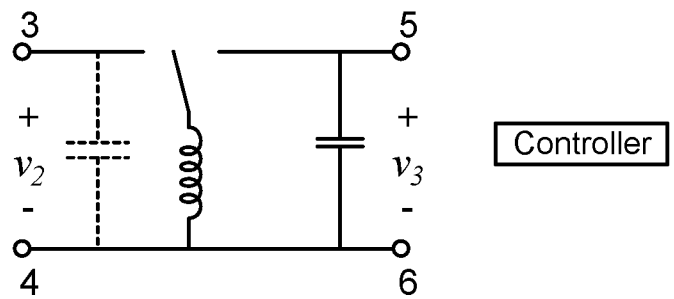
Figure 3D:
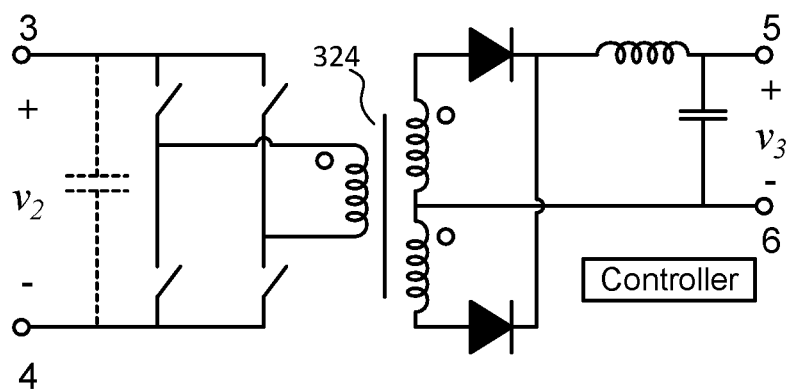
Figure 3E:
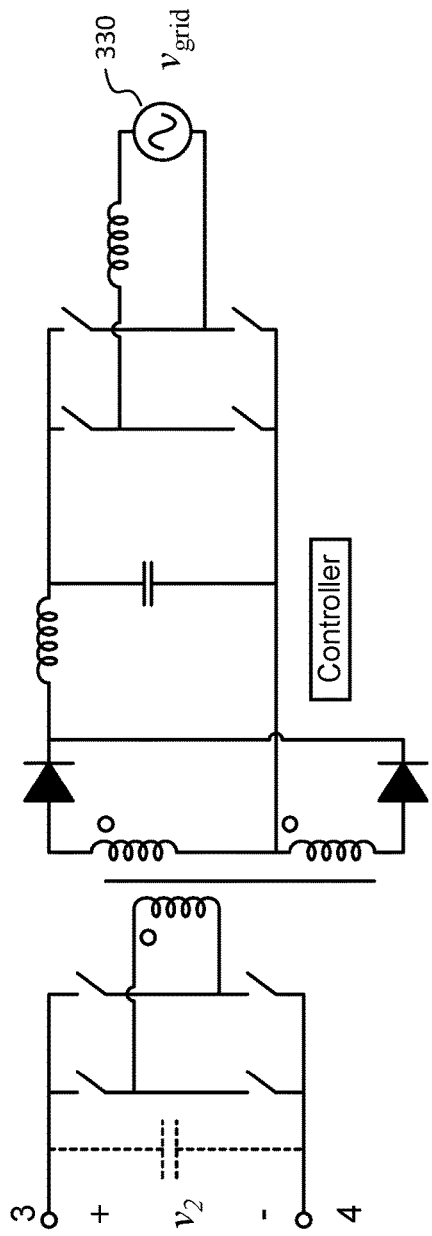
Figure 3F:
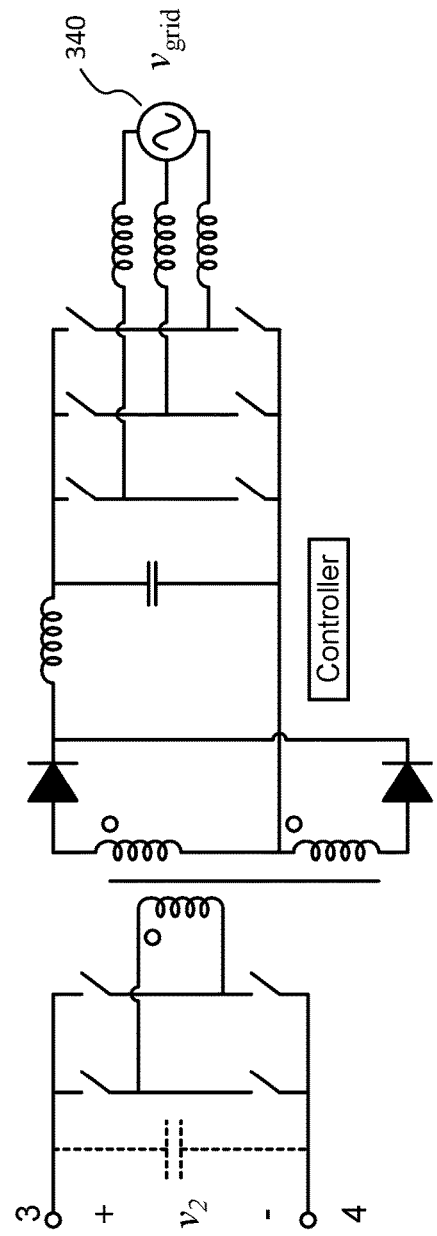

FIGS. 3A through 3F show various power converters, which may be example embodiments of power converter 118 in FIGS. 1A-1C, and which may be used as part of a voltage clamp with power recovery in various embodiments of the present disclosure, such as voltage clamps 100, 101, 150 as depicted in FIGS. 1A-1C. In each of FIGS. 3A-3F, nodes 3 and 4 may correspond to the internal nodes, e.g. a controlled-voltage node and a controlled-voltage reference node, respectively as in FIGS. 1A-1C, and nodes 5 and 6 may correspond to output nodes of a power converter as depicted in FIGS. 1A-1C. FIG. 3A shows a buck-converter circuit that can be used when no isolation between voltage v2, 316, and voltage v3, 318, is required (i.e., v2 and v3 may share a common ground reference), and the desired clamp voltage v2 is less than the sink voltage v3. In FIG. 3A, node 3, 312, may be an embodiment of the controlled voltage node 110 of FIG. 1, and node 4, 320, may be an embodiment of the controlled voltage reference node 112 of FIG. 1, and nodes 5, 314, and 6, 322, may be embodiments of the outer nodes of the power converter, configured to be coupled to a power sink, such as power sink 104 of FIG. 1C. The same holds for nodes 3 and 4 in FIGS. 3B through 3F and for nodes 5 and 6 in FIGS. 3B through 3D. In some embodiments, a buck converter may contain an optional input capacitor 306 as shown in FIG. 3A (and analogous capacitors shown in FIGS. 3B through 3F), to assist with holding the input voltage constant, while in other embodiments, an otherwise analogous buck converter may omit such a capacitor between internal nodes 3, 4. As shown in FIG. 3A, buck converter 301 further contains a switch 302, diode 308, inductor 304 and output capacitor 310. The output capacitor 310 may be part of the power sink rather than part of the buck converter. The buck converter is operated in a way to maintain the input voltage constant rather than to maintain an output voltage. For example, if the input voltage, v2, 316, is below the desired clamping voltage, a controller 319 may leave the buck converter switch in the off or open state until such time as the clamping voltage rises above the desired clamping voltage at which time the switch 302 may be operated in a periodic fashion (e.g. switching at a 100 kHz rate) in which the duty cycle, i.e. the fraction of time that switch 202 is closed, is increased in order to reduce the clamping voltage, v2, 316. Alternate methods of operating the switch 302 by controller 319 include closing switch 302 when the input voltage 316 is above the desired clamping voltage and opening the switch when the input voltage 316 is below the desired clamping voltage with some hysteresis and further opening switch 302 if the current through the inductor 304 exceeds a safe level. FIG. 3B shows a boost converter which may be used in cases where no isolation between v2 and v3 is required and the clamping voltage v2 is less than the power sink voltage v3. FIG. 3C shows a buck-boost converter which may be used if no isolation between v2 and v3 is required and the voltage v3 with respect to the common node 4 and node 6 has the opposite polarity of the clamping voltage with respect to the common node 4 and node 6. FIG. 3D shows an isolated DC to DC converter that can be used when isolation between the input and output of the converter is required and the power sink is a DC sink such as a DC bus. In FIG. 3D, isolation is achieved with a transformer 324. FIG. 3E shows a converter that can be used when the power sink is a single-phase AC utility supply. FIG. 3F shows a converter that can be used when the sink is a three-phase AC utility supply.

Figure 4A:
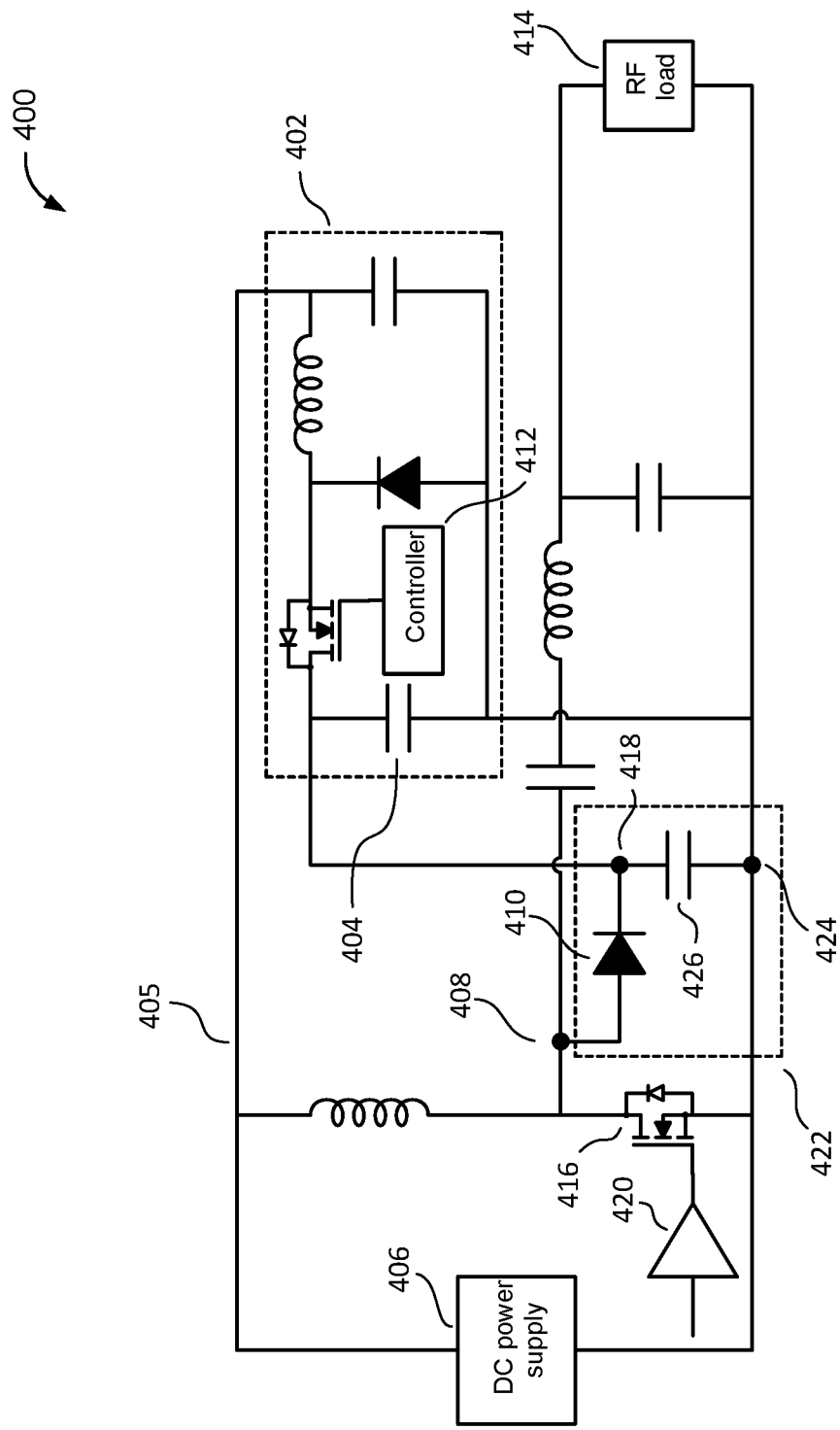
FIG. 4A illustrates the use of a voltage clamp in a RF amplifier circuit according to one embodiment of the present disclosure.

FIG. 4A depicts a RF power amplifier 400 comprising a voltage clamp with power recovery, in accordance with another illustrative embodiment. FIG. 4A shows the use of a voltage clamp with power recovery to protect a power device 416 in a RF power amplifier 400 from overvoltage. In this case the power sink is the rail voltage 405 supplied by a DC power supply 406 to power the RF power amplifier. The rail voltage 405 is a suitable power sink because the power recovered by the voltage clamp cannot exceed the power delivered by the DC supply 406. In this application the sink voltage is always less than the clamping voltage and the sink and clamp can share a common ground reference so a buck converter 402 can be used as the power converter. The rectifier 422 includes a single diode 410. In applications such as this where a RF frequency (i.e., a high frequency where parasitic inductance and stray capacitance can easily prevent proper operation of the circuit) is clamped, a capacitor 426 may be included close to the rectifier. A controller 412 controls the buck converter 402 in such a way that the input voltage of the buck converter 402 remains one diode voltage drop below the desired clamping voltage. This ensures that the voltage between the protected node 408 and reference node 424 stays at or below the desired clamping level. The buck converter input voltage is the voltage of the controlled voltage node 418 with respect to the controlled voltage reference node 424. To assist with maintaining the converter input voltage, a capacitor 404 may be included at the power converter input. This puts the capacitor 426 and capacitor 404 in parallel, but capacitor 426 may likely be a small capacitor (e.g., a 3 nanofarad (nF) ceramic capacitor) with good high frequency properties and may be mounted close to the protected node 408 and reference node 424, and capacitor 404 may likely be a larger capacitor with larger energy storage capability (e.g., a 100 µF electrolytic capacitor). The RF power amplifier 400 may contain a driver 420 for driving the power device 416, and the RF power amplifier may be connected to a load 414 such as a plasma load.

Figure 4B:
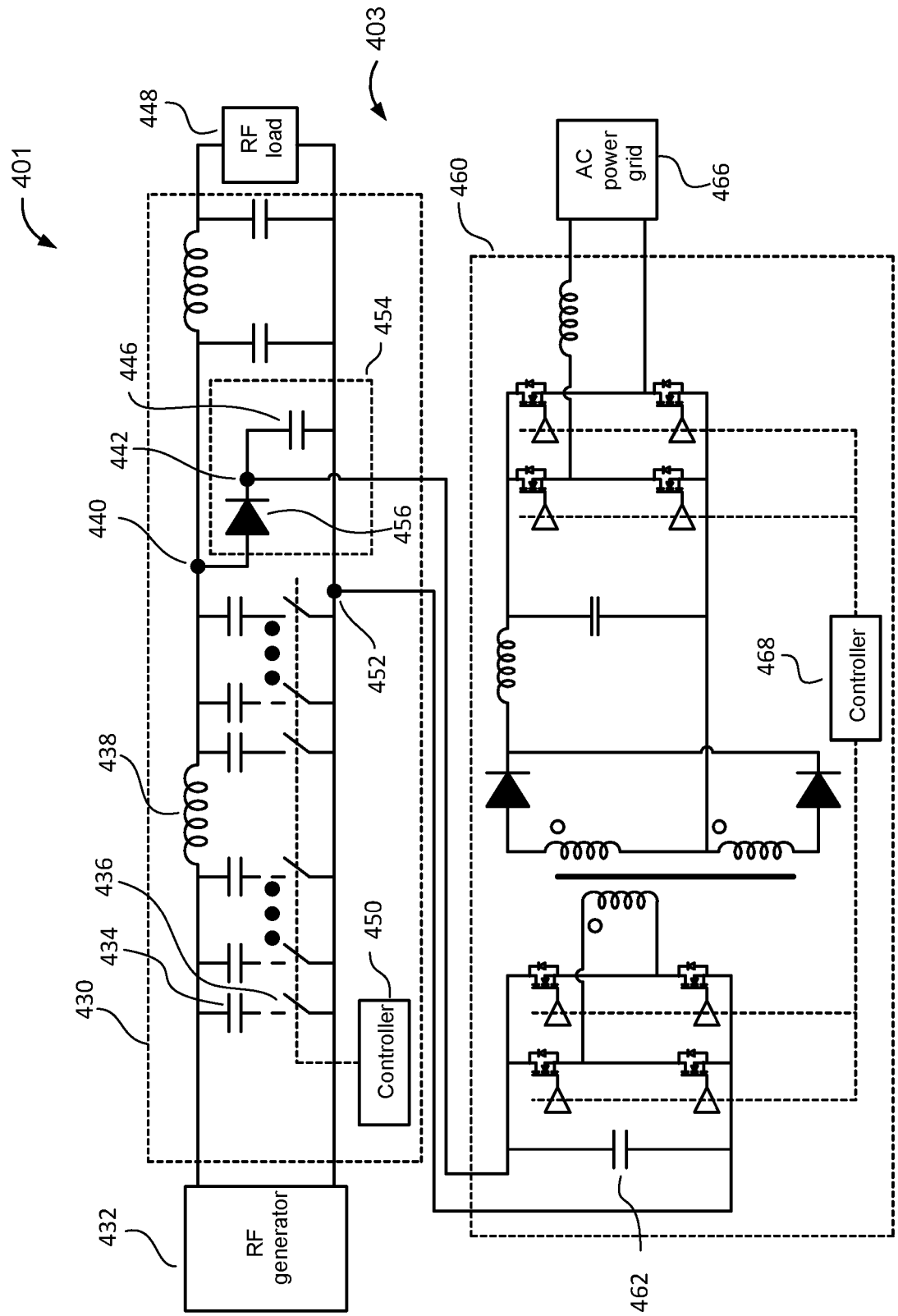
FIG. 4B illustrates the use of a voltage clamp with power recovery in a RF impedance matching circuit according to another embodiment of the present disclosure.

FIG. 4B depicts a RF system 401 with a solid-state matching network 430 and voltage clamp 403 with power recovery, in accordance with another illustrative embodiment. In FIG. 4B, voltage clamp 403 includes rectifier 454 and power converter 460. FIG. 4B shows the use of a voltage clamp 403 with power recovery to limit the voltage at a protected node 440 relative to a reference node 452 in a solid-state matching network 430. The solid-state matching network 430 connects a RF generator 432 to a load 448. A controller 450 in the solid-state matching network controls switches 436 to connect and disconnect capacitors 434 from the network. The solid-state network also contains fixed components such as inductor 438. Without the voltage clamp 403, during operation of the circuit, sudden changes in the characteristics of the load 448, which may be a plasma load, could cause overvoltage conditions of the protected node 440 relative to the reference node 452. The voltage clamp 403 contains a rectifier 454, which includes a diode 456 and a capacitor 446. The rectifier 454 is connected to a power converter 460. The power converter may include an input capacitor 462, and a controller 468 of the power converter maintains a constant voltage between the controlled voltage node 442 and controlled voltage reference node 452 that is one diode voltage drop below the desired clamping voltage. The controller 468 also controls circuitry for transferring power to a single phase of an AC utility supply 466 that is acting as a power sink.

Figure 5B:
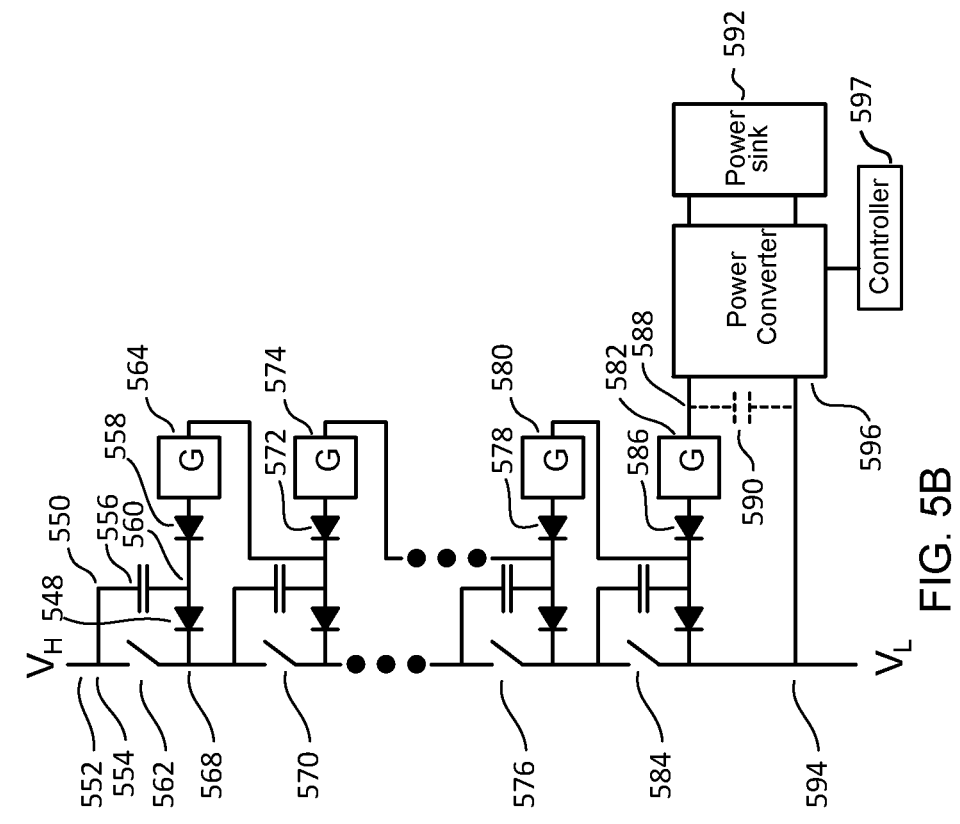
FIGS. 5A and 5B illustrate example implementations of a voltage clamp with power recovery in a stacked switch circuit according to embodiments of the present disclosure.
Figure 5A:
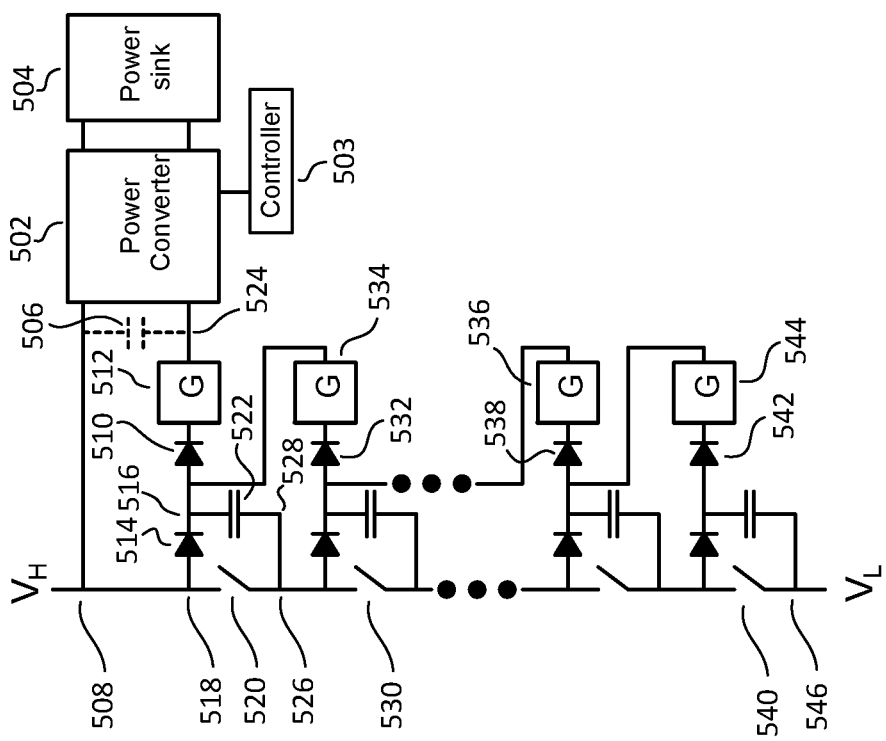
Figure 5C:
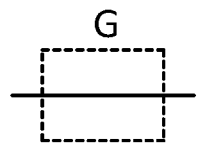
FIGS. 5C-5F illustrate example implementations of circuit elements that may help manage or limit a peak current through selected circuit portions in a stacked switch circuit, according to embodiments of the present disclosure.
Figure 5D:
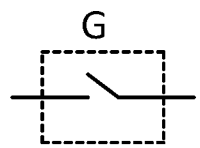
Figure 5E:
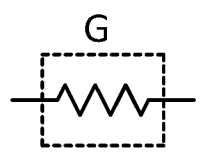
Figure 5F:
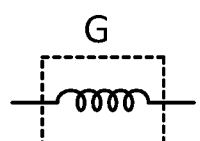

FIGS. 5A and 5B show implementations of voltage clamps with power recovery in stacked switch circuits 501, 547, according to different embodiments of the present disclosure. In FIG. 5A, stacked switch circuit 501 includes several switches, of which 520, 530 and 540 are labeled, which are connected in series between a high voltage node $V_H$ at protected node 508 and a low voltage node $V_L$ at reference node 546. During normal operation of the switch, voltage $V_H$ is at a higher voltage than voltage $V_L$ during at least part of the time that the switches are all open, and voltage $V_H$ is at essentially the same voltage as voltage $V_L$ when the switches are all closed. Each switch is associated with its own respective local protected node and reference node, e.g., local protected node 518 and local reference node 526 associated with switch 520, the combined effect of which is to effectuate protected node 508 and reference node 546. For each switch, a local rectifier, local to the respective switch—in this case a single diode, e.g. diode 514, acting as a local rectifier associated with switch 520—connects the switch's local protected node (e.g., 518) and local reference node (e.g., 526) to a capacitor associated with that respective switch (e.g., capacitor 522 local to switch 520), which is connected between a local controlled voltage node (e.g., 516) and a local controlled voltage reference node (e.g., 528). In this case, the reference node 526 is the same as the controlled voltage reference node 528. The voltage between the controlled voltage node 516 and controlled voltage reference node 528 is maintained at a desired clamping voltage by connecting a power converter between the high voltage node 508 and a common converter input node 524 and an arrangement of diodes, of which diodes 510, 532, 538, and 542 are labeled, in such a way that when the switches are all closed, current can flow from the controlled voltage nodes of each switch (of which, e.g., controlled voltage node 516 is the controlled voltage node local to and associated with switch 520) through the arrangements of diodes, through optional elements G, through the converter and optional capacitor 506 to the high voltage node, through some of the switches 520, 530, and 540 to the controlled voltage reference node of the switch, and through the capacitor of the switch (of which e.g., 522 is the capacitor local to switch 520), and back to the controlled voltage node of the switch, when the voltage between the controlled voltage node and controlled voltage reference node associated with the switch is above a desired limit.

The diodes that are part of the arrangement 510, 532, 538, and 543 of diodes can be put in series with optional elements G, of which 512, 534, 536, and 544 are labeled. These optional elements can be e.g., a short circuit (i.e., there is no optional element G installed), a resistor, an inductor, or a switch, as illustratively shown in the embodiments of FIGS. 5C, 5D, 5E and 5F, to name a few. The optional elements G, when installed, can limit the peak current through the diodes 510, 532, 538, and 542 when the switches 520, 530, and 540 close in the case where the converter maintains a constant input voltage or when the optional capacitor 506 is installed. When the optional elements G are switches, the switches can be closed (under the control of controller 503) when the voltage between the controlled voltage node and controlled voltage reference node of the corresponding switch 520, 530, or 540 is above a threshold voltage. In this case, the power converter 502 can, for example, be embodied fairly analogously as the buck converter 301 of FIG. 3A, except in which the capacitor 306 and switch 302 are eliminated, because those functions may be performed instead by the local capacitor connected between the local controlled voltage node and local controlled voltage reference node of each switch (of which 522 is an example), and/or by the local switch G (of which 512 is an example).

The power converter 502 directs power to a power sink 504. Note that in this arrangement the voltage at which the voltage over the switch is clamped increases by a diode drop across each local switch from the switch 520 closest to the power converter 502 towards switch 540 furthest from the power converter. This is acceptable in most contexts given that the desired clamping voltage is typically much higher (e.g., 900 V) than a typical diode voltage drop (e.g., 1 V). Because the local capacitors associated with each switch (e.g., capacitor 522 associated with switch 520) absorb charge when the switches are off, and the voltage over the switch is higher than the capacitor voltage and a diode drop and only discharges through the power converter and optional capacitor 506 once the switches close, the capacitor may be large enough to absorb the charge without the capacitor voltage significantly exceeding the desired clamping voltage.

The stacked switch circuit 547 with voltage clamp with power recovery shown in FIG. 5B is somewhat similar to stacked switch circuit 501 shown in FIG. 5A, except that in this case the power converter 596 is installed between a low voltage node 594 at low voltage $V_L$ and a common node 588 rather than between the high voltage node 508 and common node 524. In FIG. 5B several switches of which 562, 570, 576, and 584 are labeled are connected in series between a high voltage node $V_H$ 552 and a low voltage node $V_L$ 594. During normal operation of the switch $V_H$ is at a higher voltage than $V_L$ during at least part of the time that the switches are all open and $V_H$ is at essentially the same voltage as $V_L$ when the switches are all closed. Each switch is associated with a protected node 554 and reference node 568. A rectifier—in this case a single diode 548—connects the protected node 554 and reference node 568 to a capacitor 556 that is connected between a controlled voltage node 550 and controlled voltage reference node 560. In this case the protected node 554 is the same as the controlled voltage node 550. The voltage between the controlled voltage node 550 and controlled voltage reference node 560 is maintained at a desired clamping voltage by connecting a power converter between the low voltage node 594 and a common converter input node 588 and an arrangement of diodes of which 558, 572, 578, and 586 are labeled in such a way that when the switches 562, 570, 576, and 584 are all closed, current can flow from the controlled voltage nodes of each switch (of which e.g., 550 is the controlled voltage node of switch 562) through the capacitor of the switch (of which e.g., 556 is the capacitor of switch 562), through the arrangements of diodes, through the elements G, to the converter common node 588, through the converter and optional capacitor 590 to the low voltage node 594, through some of the switches 584, 576, 570, and 562 and back to the controlled voltage node of the switch when the voltage between the controlled voltage node and controlled voltage reference node associated with the switch is above a desired limit. The diodes that are part of the arrangement 558, 572, 578, and 586 of diodes can be put in series with optional elements G of which 564, 574, 580, and 582 are labeled. These optional elements can be e.g., a short circuit (i.e., there is no optional element G installed), a resistor, an inductor, or a switch, as shown in FIGS. 5C, 5D, 5E, and 5F, to name a few. The optional elements G, when installed, can limit the peak current through the diodes 558, 572, 578, and 586 when the switches 562, 570, 576, and 584 close in the case where the converter maintains a constant input voltage or when the optional capacitor 588 is installed. When the optional elements G are switches, the switches G can be closed when the voltage between the controlled voltage node and controlled voltage reference node of the corresponding switch 562, 570 or 576, or 584 is above a threshold. In this case the power converter 596 can for example be the buck converter of FIG. 3A in which the capacitor 306 and switch 302 are eliminated because those functions are taken over the by the capacitor connected between the controlled voltage node and the controlled voltage reference node of each switch (of which 556 is an example) and the switch G (of which 564 is an example). The power converter 596 directs power to a power sink 592. Note that in this arrangement the voltage at which the voltage over the switch is clamped increases by a diode drop as you move from the switch 584 closest to the power converter 596 towards switch 562 furthest from the power converter. This is normally acceptable given that the desired clamping voltage is typically much higher (e.g., 900 V) than a typical diode voltage drop (e.g. 1 V).

Stacked switch circuits 501, 547 of FIGS. 5A, 5B may thus each serve as embodiments of a voltage clamp with power recovery for multiple series connected switches. These series switch voltage clamps each include a plurality of switches, each having a first and second node connected in series between a high voltage node and a low voltage node. The first node of the first switch is connected to the high voltage node, the first node of each successive switch of the plurality of switches is connected to a second node of a preceding switch of the plurality of switches, and a second node of the last switch is connected to the low voltage node. Each of these stacked switch circuits further includes a plurality of capacitors, each associated with one of the switches. Each of these stacked switch circuits further includes a plurality of rectifiers, wherein each respective rectifier among the plurality of rectifiers is associated with a respective switch of the plurality of switches, wherein each rectifier connects two nodes of the respective switch to a respective capacitor of the plurality of capacitors, associated with the switch, in such a way that a voltage difference between the two nodes of the respective switch is limited to a sum of a capacitor voltage of the respective capacitor and a rectifier voltage drop of the respective rectifier. Each of these stacked switch circuits further includes a power converter. Each of these stacked switch circuits further includes a circuit comprising at least one diode, wherein the power converter is coupled to the capacitors with the circuit, and directly or indirectly to at least one of the high voltage node and low voltage node. Each of these stacked switch circuits further includes one or more output nodes, coupled to the power converter and configured to couple to a power sink, wherein the circuit and the power converter are configured to reduce the voltages of the capacitors associated with the switches below a clamping voltage when the switches are closed, by outputting power via the one or more output nodes.

Figure 6:
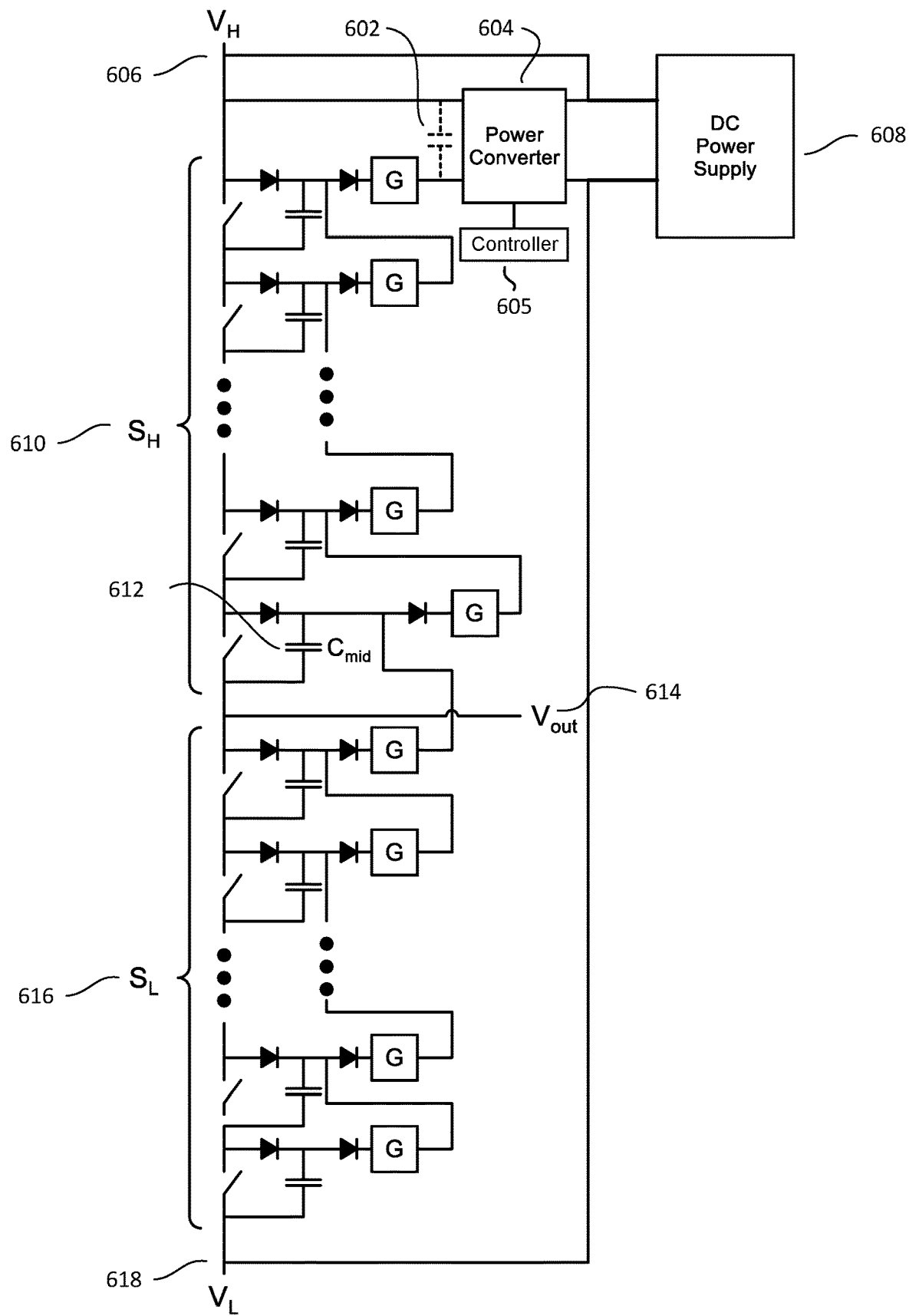
FIG. 6 illustrates an example implementation of a voltage clamp with power recovery in a stacked switch half-bridge circuit according to one embodiment of the present disclosure.

FIG. 6 shows two stacked switches $S_H$ 610, and $S_L$ 616, arranged in a half-bridge configuration with voltage clamps with power recovery according to an embodiment of the present disclosure. The upper switch $S_H$ 610 connects between a high voltage node $V_H$ 606 and an output node $V_{out}$ 614 and the lower switch $S_L$ 616 connects between the output node 614 and a low voltage node $V_L$ 618. A DC power supply 608 that powers the half-bridge connects to the high voltage node $V_H$ 606 and low voltage node $V_L$ 618 and acts as the power sink for the converter 604. The output of the half bridge $V_{out}$ 614 can connect to another circuit or a load. The operation of this stacked switch is similar to the operation of the stacked switch of FIG. 5A, except that instead of all the switches opening and closing at essentially the same time as in FIG. 5A, here the switches comprising the lower switch $S_L$ 616 open and close at the same time, the switches comprising the upper switch $S_H$ open and close at the same time, and the switches of the upper 610 and lower switch 616 never, under normal operation, close at the same time. When the switches comprising the lower switch $S_L$ 616 close, current is directed through the capacitor 612 associated with that switch of the upper switch that connects to the lower switch if any of the voltages over the capacitors associated with the lower switches are higher than the desired clamping voltage. This capacitor 612 is labeled $C_{mid}$. Because $C_{mid}$ absorbs all the charge from the capacitors associated with the switches of the lower switch when any of those capacitor voltages are above the desired clamping voltage, $C_{mid}$ typically needs to have a larger capacitance and handle a higher ripple current than the other capacitors associated with the switches. When the switches associated with the upper switch $S_H$ 610 close, current can flow though the converter 604 and optional capacitor 602 if any of the voltages over the capacitors associated with the upper switches, including $C_{mid}$ are higher than the desired clamping voltage.

Figure 7:
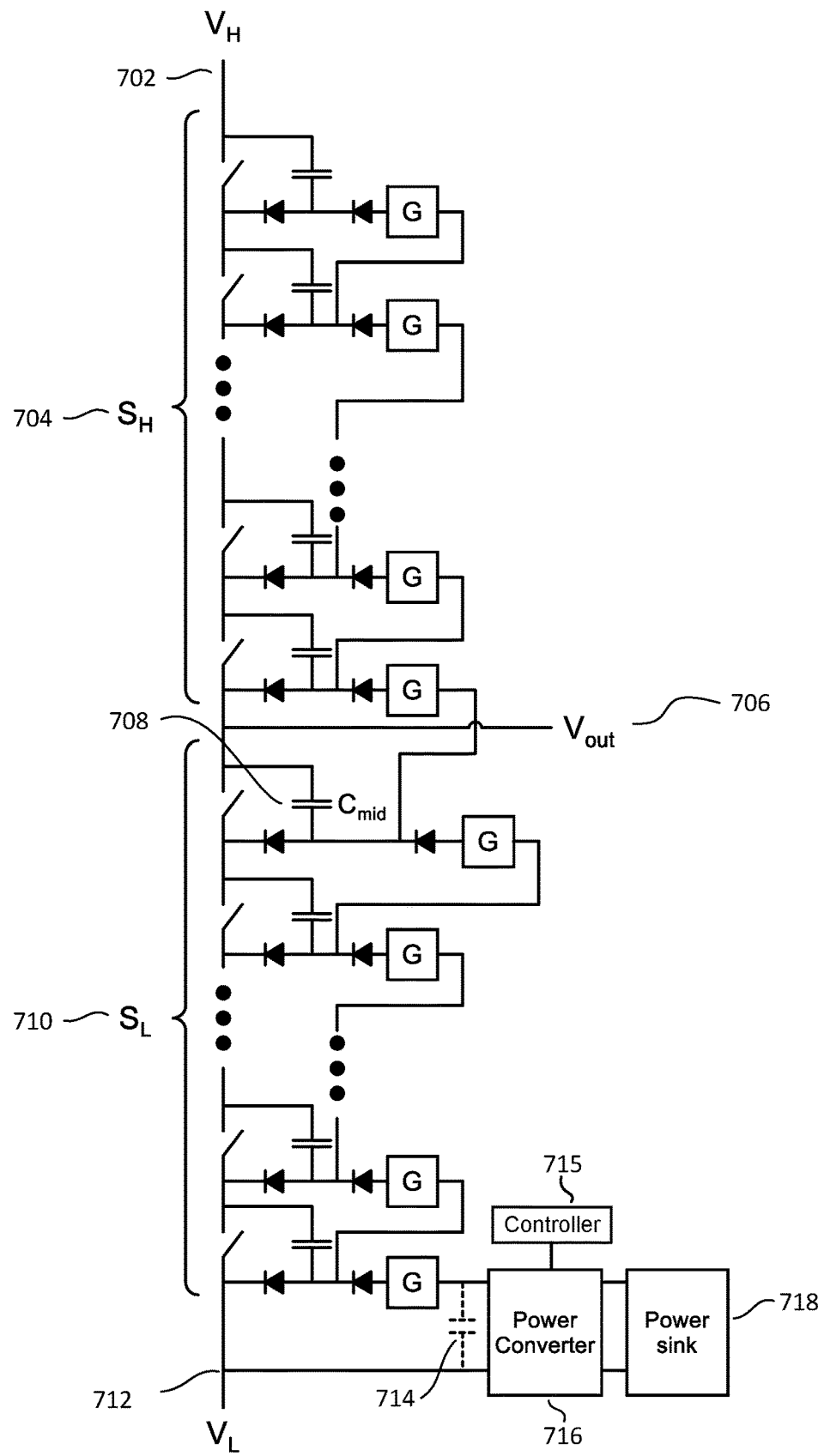
FIG. 7 illustrates an example implementation of a voltage clamp with power recovery in a stacked switch half-bridge circuit according to one embodiment of the present disclosure.

FIG. 7 shows an alternate arrangement of two stacked switches arranged in a half-bridge configuration with voltage clamps with power recovery according to an embodiment of the present disclosure. The difference between this arrangement and the arrangement of FIG. 6 is that the power converter 716 and optional capacitor 714 are connected to the low voltage node 712 rather than the high voltage node 702. The capacitor $C_{mid}$ 708 is now associated with that switch in the lower switch $S_L$ 710 that connects to the upper switch $S_H$ 704. When the upper switch 704 closes and if any of the voltages over the capacitors associated with the switches belonging to the upper switch exceed the desired clamping voltage, current flows through capacitor $C_{mid}$ 708. When the lower switch $S_L$ 710 closes and any of the capacitor voltages associated with the switches belonging to the lower switch $S_L$ 710 exceed the desired clamping voltage, current can flow through the converter 716 and optional capacitor 714. The converter 716 connects to a power sink 718 which may, as in FIG. 6 be a DC supply connected to the high voltage node $V_H$ and low voltage node $V_L$. The output of the half-bridge $V_{out}$ 706 may connect to other circuitry or a load.

Figure 8:
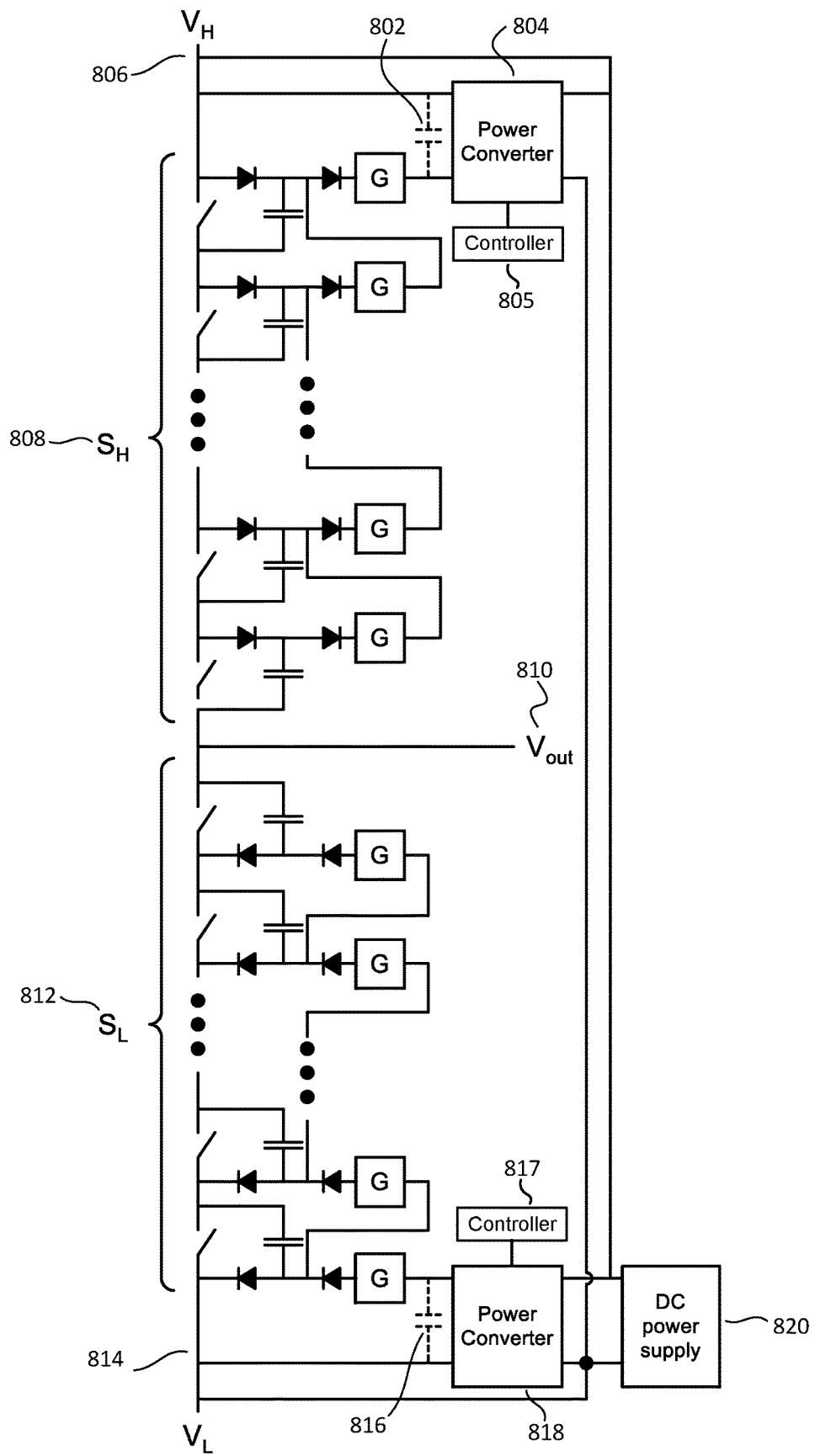
FIG. 8 illustrates an example implementation of a voltage clamp with power recovery in a stacked switch half-bridge circuit according to one embodiment of the present disclosure.

FIG. 8 shows yet another arrangement of two stacked switches arranged in a half-bridge configuration with voltage clamps with power recovery according to an embodiment of the present disclosure. In this case two converters 804 and 818 are utilized, one connected to the high voltage node $V_H$ 806 and one connected to the low voltage node $V_L$ 814. The power sink connected to both converters is a DC supply 820 supplying power to the half-bridge and connected to the high voltage node 806 and low voltage node 814. One or both converters may have optional capacitors 802, 816 connected across the converter inputs. The operation of the voltage clamp with power recovery associated with the upper switch $S_H$ 808 is similar to the operation of the switch of FIG. 5A while the operation of the lower switch $S_L$ 812 is similar to the operation of the switch of FIG. 5B. The output of the half-bridge $V_{out}$ 810 may connect to other circuitry or a load.

Figure 9:
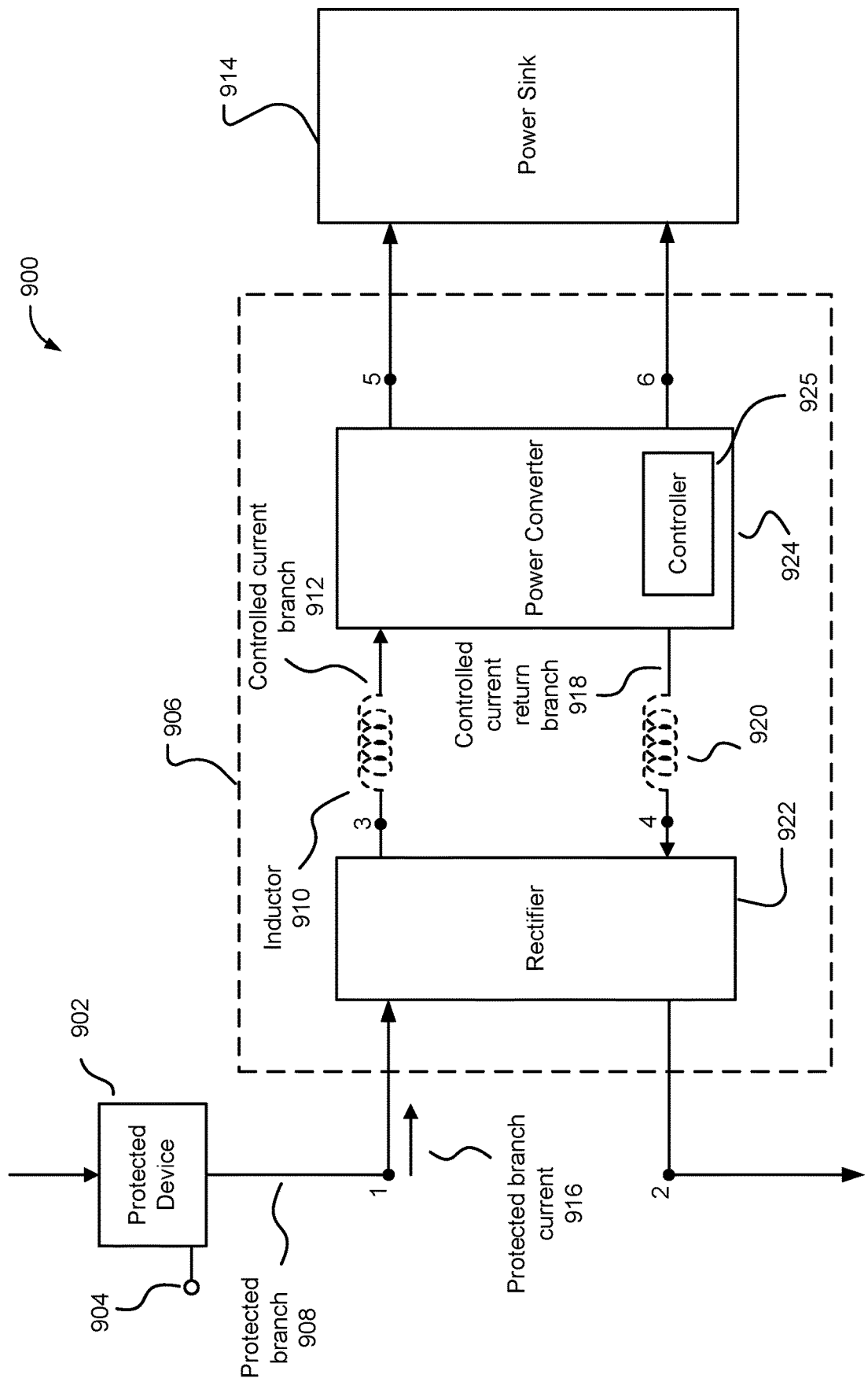
FIG. 9 illustrates a block diagram of an example current clamp with power recovery according to one embodiment of the present disclosure.

FIG. 9 illustrates a block diagram of an example current clamp with power recovery 906 in a system 900 according to one embodiment of the present disclosure. The current clamp with power recovery 906 connects a protected branch 908 to a power sink 914. The current clamp with power recovery 906 limits a component of a current 916 in the protected branch 908 by diverting power to the power sink 914. A rectifier 922 connects the protected branch to the input of a power converter 924. The power converter 924 maintains a constant current in a controlled current branch 912 and controlled current return 918 by directing power to a power sink 914. The power sink 914 may e.g., be a DC rail in a power amplifier or an AC utility supply. The power converter input current flows in a controlled current branch 912 and a controlled current return 918, both connected to the rectifier 922. Optional inductors 910 and 920 in the controlled current branch 912 and controlled current return 918 help maintain current in the controlled current branch 912 and controlled current return 918 but depending on the power converter design and distance between the rectifier and power converter may be eliminated. A protected device 902 may be inserted in series with the protected branch. The drain and source terminals of a MOSFET device may for example be inserted in series with the protected branch. The protected device may have other terminals 904. The design of the rectifier 922 determines which component of the current 916 will be limited. The component of the current may for example be the maximum value, the minimum value, the absolute value, the maximum of the low frequency component, the absolute value of the high frequency component etc.

Figure 10A:
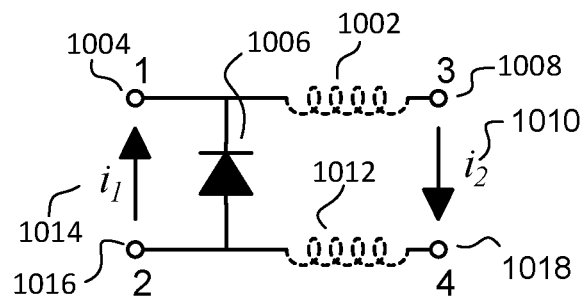
FIGS. 10A-10J illustrate various rectifier circuits that can be used in connection with a current clamp with power recovery in various embodiments of the present disclosure.
Figure 10B:
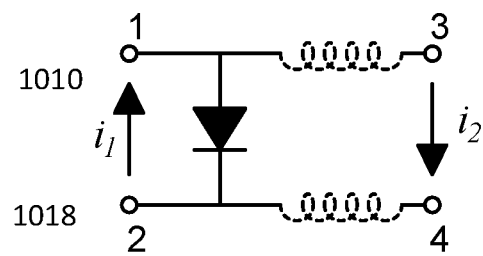
Figure 10C:
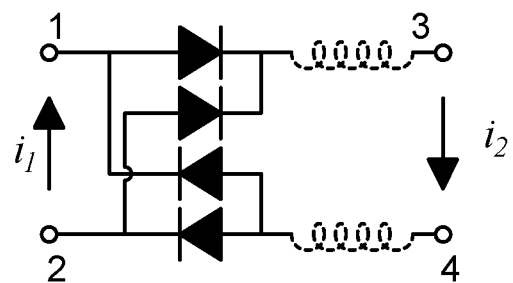
Figure 10D:
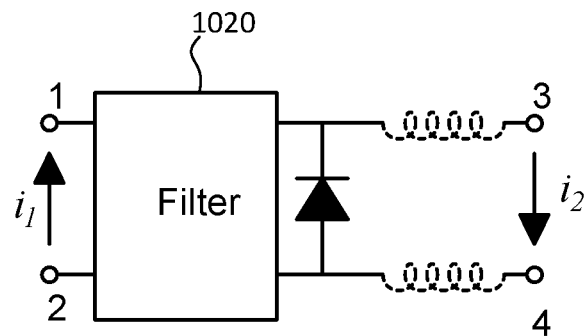
Figure 10E:
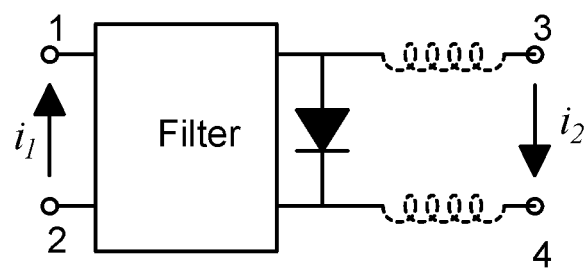
Figure 10F:
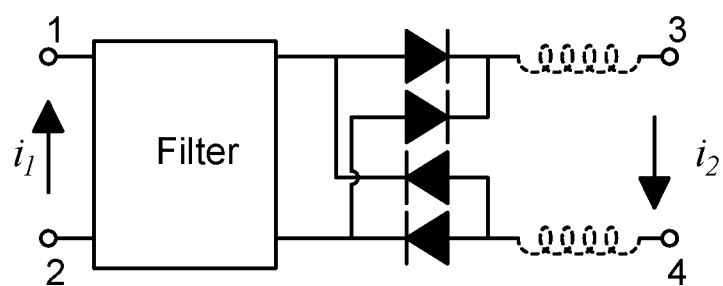
Figure 10G:
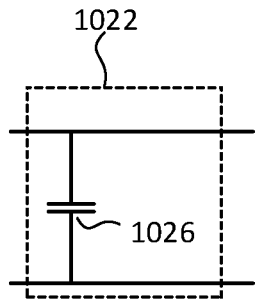
Figure 10H:
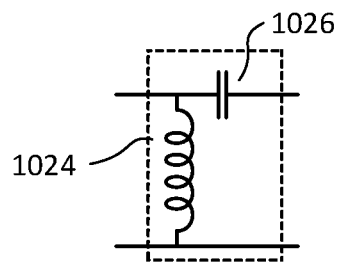
Figure 10I:
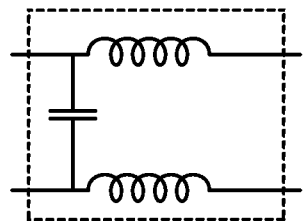
Figure 10J:
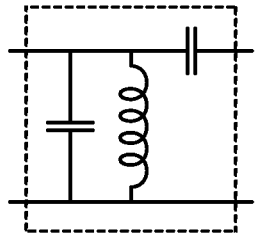

FIGS. 10A through 10J show various rectifiers (e.g., rectifier 922 in FIG. 9) and rectifier sub-circuits that can be used in connection with a current clamp with power recovery in various embodiments of the present disclosure. FIG. 10A shows a rectifier capable of limiting a current $i_1$, 1014, to a maximum value equal to the current $i_2$, 1010. In some cases, the diode 1006 may be replaced by multiple diodes in series to withstand higher voltages when the diode is in the off state. In FIGS. 10A through 10F nodes labeled 1 through 4 correspond to the nodes numbered 1 through 4 in FIG. 9, $i_1$ is the protected branch current 916 of FIG. 9, and $i_2$ is the current in the controlled current branch 912 of FIG. 9. The same holds for $i_1$ and $i_2$ of FIG. 10B through FIG. 10F. The rectifier of FIG. 10A contains a single diode (or multiple series connected diodes acting like a diode with a higher effective diode voltage drop) 1006 and may optionally include inductors 1002 and 1012 which correspond to the optional inductors 910 and 920 of FIG. 9. The rectifier of FIG. 10B limits the value of $i_1$ to a minimum equal to the value of the current $i_2$. The rectifier of FIG. 10C limits the amplitude of the current $i_1$ to a value equal to the value of the current $i_2$. Each of the rectifiers shown in FIG. 10A through 10C can be combined with filters 1020 to further select components of the current $i_1$ as shown in FIG. 10D through 10F. A few possible topologies for the filter 1020 are shown in FIG. 10G through 10J. The filter 1022 of FIG. 10G contains a single capacitor 1026 and selects the low frequency or DC component of the current $i_1$ for clamping allowing the high frequency, AC or RF components of $i_1$ to bypass the current clamp. Using the filter of FIG. 10G in the rectifier of FIG. 10D would for example limit the low frequency or DC component of $i_1$ to $i_2$ but would allow the AC or RF component of $i_1$ to go above the value of $i_2$. The filter of FIG. 10H contains a single inductor 1024 and capacitor 1026 and selects the high frequency, AC, or RF component of $i_1$ for clamping allowing the DC or low frequency component of $i_1$ to bypass the current clamp. Using the filter of FIG. 10H in the rectifier of FIG. 10F would for example limit the high frequency, AC, or RF component of $i_1$ to the value of current $i_2$ but would not limit the DC or low frequency component of $i_1$. The filter 10G does not load the circuit in which the current clamp is used, i.e., if the current $i_1$ is not in the range where it is being clamped, the current clamp does not alter the behavior of the circuit substantially. The filters of FIGS. 10H, 10I, and 10J can load the circuit in which the clamp is used. For example, the circuit of FIG. 10H creates a high impedance in the protected current branch at the parallel resonance of the inductor 1024 and the capacitor 1026 when the current $i_1$ is outside the range where it is being clamped. This is normally not a problem if the circuit in which the current clamp is employed operates in a periodic steady state and the resonance does not affect any of the harmonics of the fundamental frequency substantially.

Figure 11A:
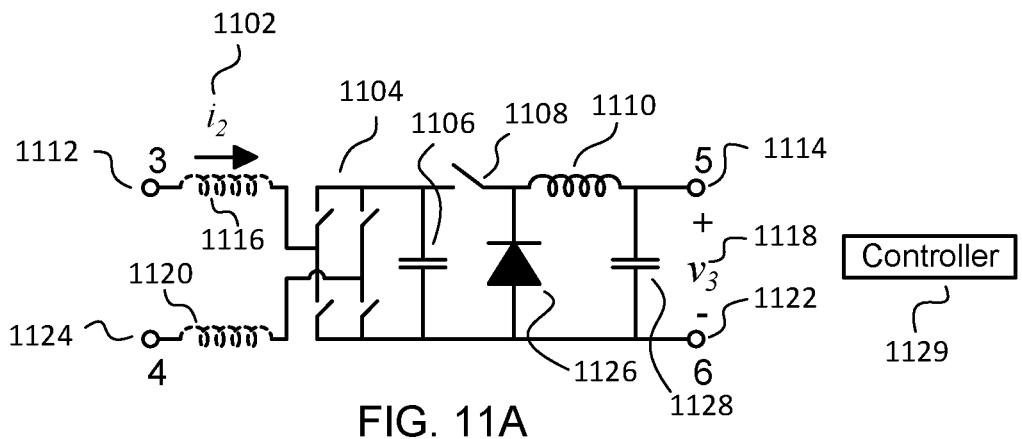
FIGS. 11A-11F illustrate various power converters that can be used in connection with a current clamp with power recovery in various embodiments of the present disclosure.
Figure 11B:
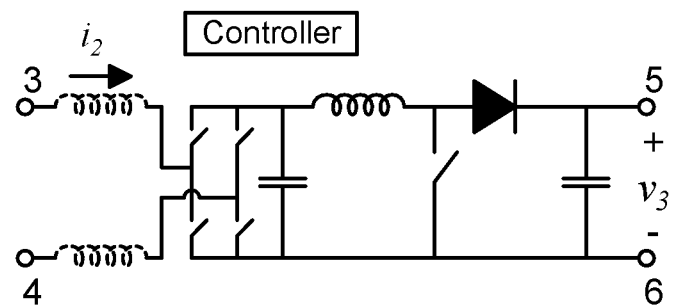
Figure 11C:
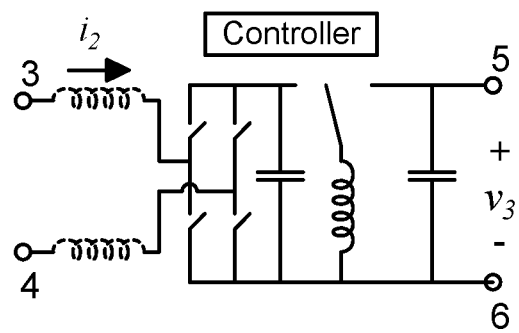
Figure 11D:
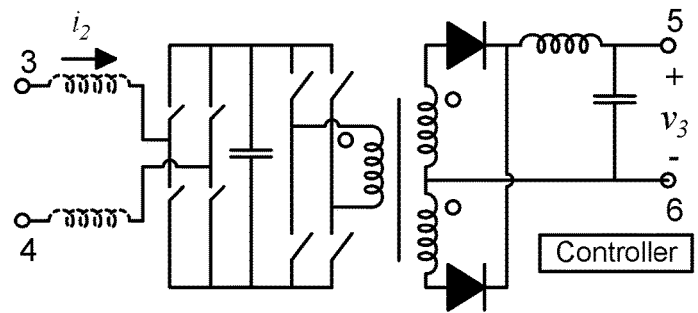
Figure 11E:
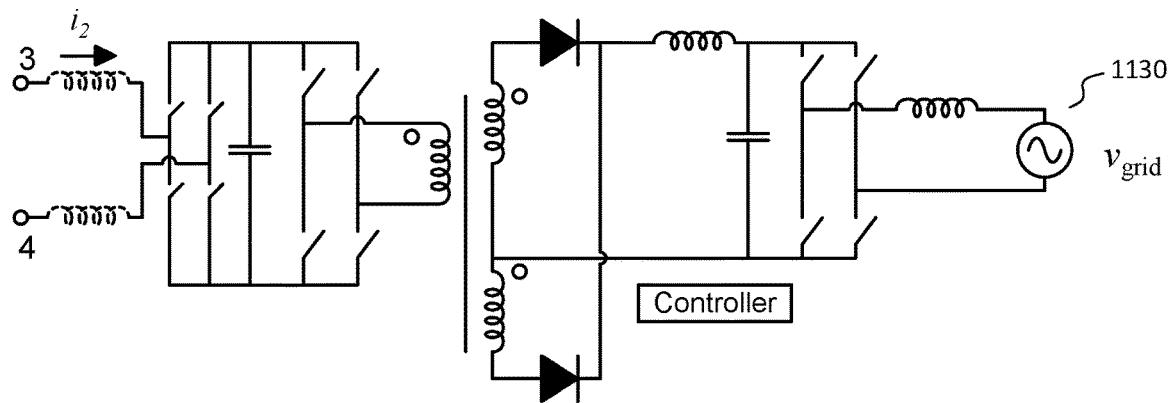
Figure 11F:
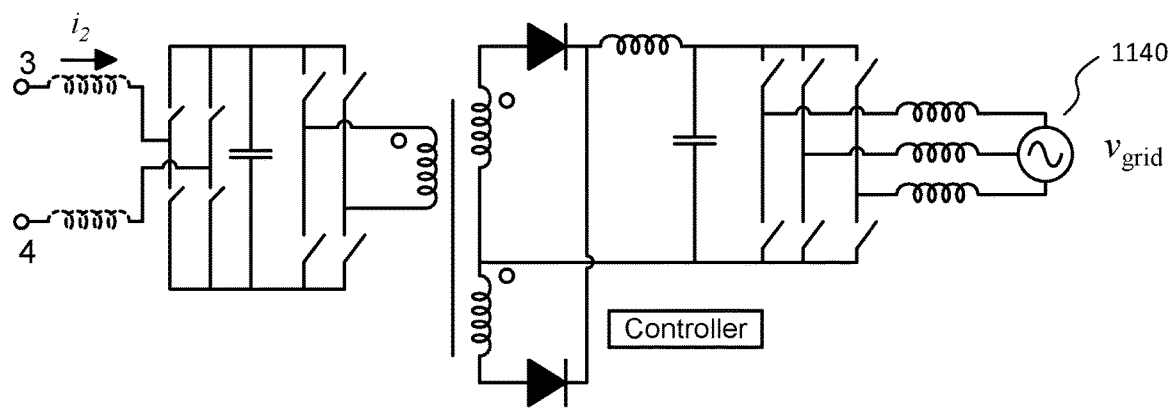

FIGS. 11A through 11F show various power converters (e.g., power converter 924 in FIG. 9) that can be used in connection with a current clamp with power recovery in various embodiments of the present disclosure. FIG. 11A shows a current source consisting of two inductors 1116 and 1120 connected to a half-bridge 1104 followed by a buck-converter. A buck converter can be used when no isolation between the protected current branch and the power sink is required (i.e., nodes in the protected branch 908 of FIG. 9, such as the nodes labeled 1 and 2 in FIG. 9 may share a common ground reference with nodes at the output of the power converter 924 such as the nodes labeled 5 and 6 in FIG. 9) and the half-bridge 1104 can operate off a voltage higher than the power sink voltage $v_3$ 1118. In FIGS. 11A through 11F the current labeled $i_2$ (1102 in FIG. 11A) is the current in the controlled current branch 912 of FIG. 9. The buck converter includes an input capacitor 1106, a switch 1108, diode 1126, inductor 1110 and output capacitor 1128. The output capacitor 1128 may be part of the power sink rather than part of the buck converter. The buck converter is a conventional buck converter, but it is operated in a way to maintain the input voltage constant rather than to maintain an output voltage. The half bridge 1104 is operated to keep $i_2$ equal to or below the desired clamping current. With a buck converter between the current source and power sink, such as in FIG. 11A, the voltage over the capacitor 1106 is typically a body diode voltage drop of switch 1108 below the power sink voltage $v_3$ 1118. This means that the current $i_2$ can typically be maintained at the desired clamping current. In the case of a boost converter connecting the current source to the power sink as in FIG. 11B it may not be possible to maintain $i_2$ at the clamping level. In this case either both bottom switches of the half-bridge 1104 or both top switches of half-bridge 1104 can remain closed while the current $i_2$ is below the desired clamping level. FIG. 11C shows a buck-boost converter connecting the current source to the power sink which may be used if no isolation between the protected current branch and power sink is required. The buck-boost converter is advantageous because the voltage over the half-bridge of the current source can be above or below the voltage of the power sink. FIG. 11D shows an isolated DC to DC converter that can be used when isolation between the input and output of the converter is required and the power sink is a DC sink such as a DC bus. In FIG. 11D isolation is achieved with a transformer. FIG. 11E shows a converter that can be used when the power sink is a single-phase AC utility supply 1130. FIG. 11F shows a converter that can be used when the sink is a three-phase AC utility supply 1140.

Figure 12A:
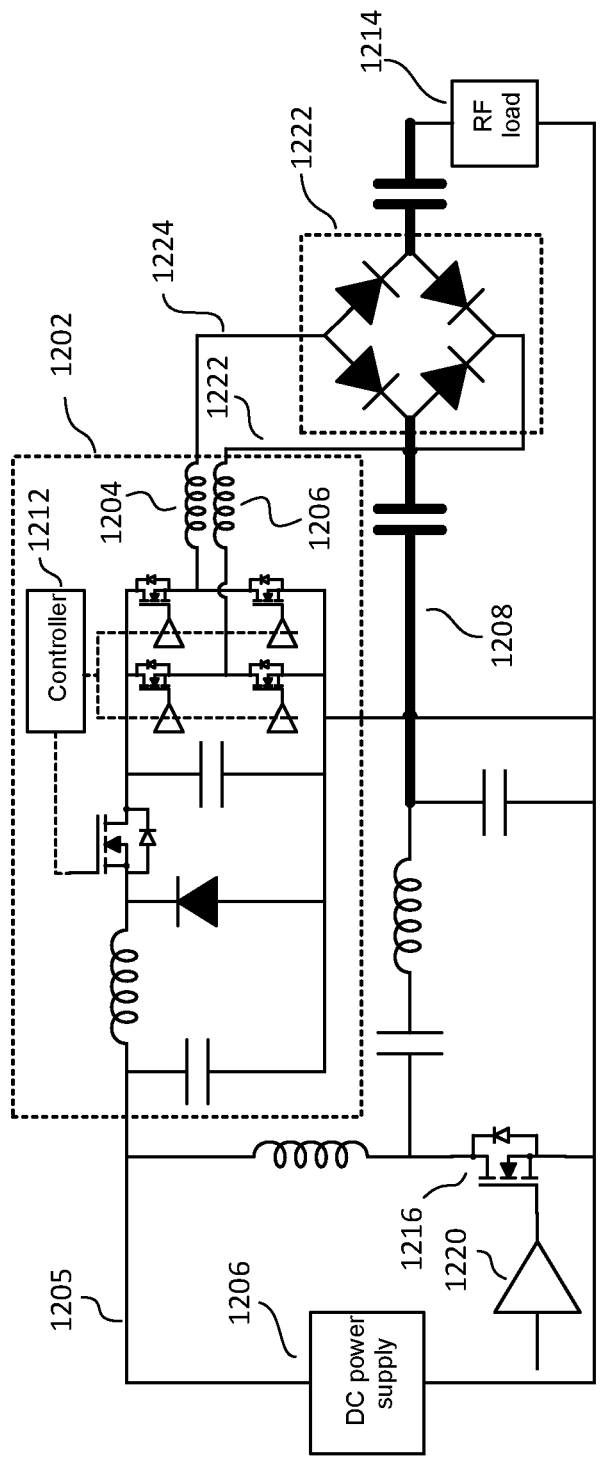
FIG. 12A illustrates the use of a current clamp in a RF amplifier circuit according to one embodiment of the present disclosure.

FIG. 12A shows the use of a current clamp with power recovery to protect a protected branch 1208 (drawn using thick lines) in a RF power amplifier from overcurrent. In this case the power sink is the rail voltage 1205 supplied by a DC power supply 1206 to power the RF power amplifier. In this application sink and clamp can share a common ground reference so current source and a buck converter 1202 can be used as the power converter. The rectifier 1222 includes four diodes in a full-bridge configuration. A controller 1212 controls the current source and buck converter is such a way that the current in the controlled current branch 1224 remains below or at the desired clamping level. This ensures that the current in the protected branch 1208 stays at or below the desired clamping level. The RF power amplifier may contain a driver 1220 for driving the power device 1216 and the RF power amplifier may be connected to a load 1214 such as a plasma load.

Figure 12B:
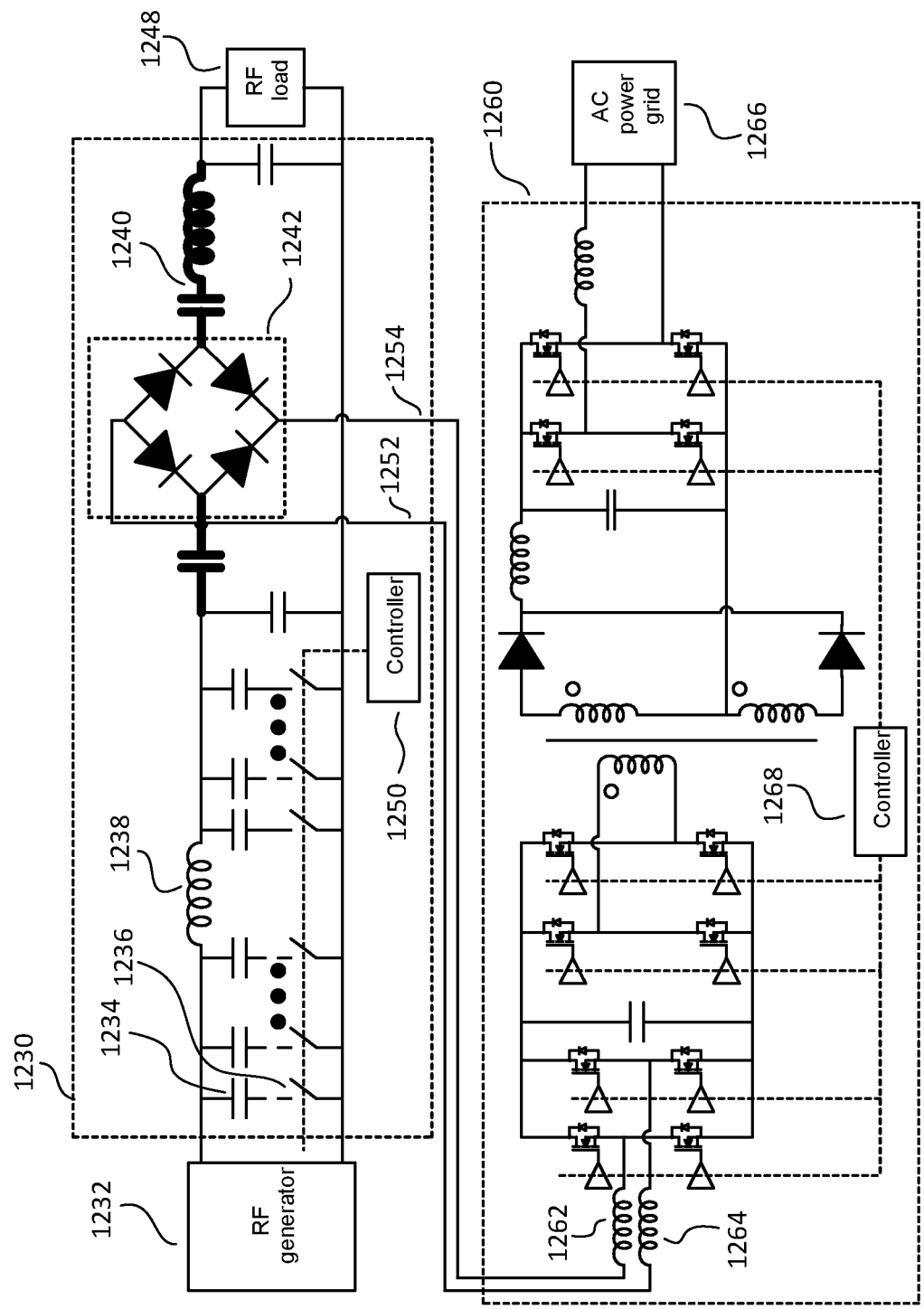
FIG. 12B illustrates the use of a current clamp with power recovery in a RF impedance matching circuit according to another embodiment of the present disclosure.

FIG. 12B shows the use of a current clamp with power recovery to limit the current in a protected branch 1240 (drawn using thick lines) in a solid-state matching network 1230. The solid-state matching network 1230 connects a RF generator 1232 to a load 1248. A controller 1250 in the solid-state matching network controls switches 1236 to connect and disconnect capacitors 1234 from the network. The solid-state network also contains fixed components such as inductor 1238. Without the current clamp, during operation of the circuit sudden changes in the characteristics of the load 1248, which may be a plasma load, can cause overcurrent conditions in the protected branch 1240. The current clamp contains a rectifier 1242. The rectifier 1242 is connected to a power converter 1260. The power converter may include input inductors 1262 and 1264 and a controller 1268 of the power converter maintains a constant current in the controlled current branch 1252 and controlled current return branch 1254 equal to or less than the desired current clamping level. The controller 1268 also controls circuitry for transferring power to a single phase of an AC utility supply 1266 that is acting as a power sink.

Figure 13:
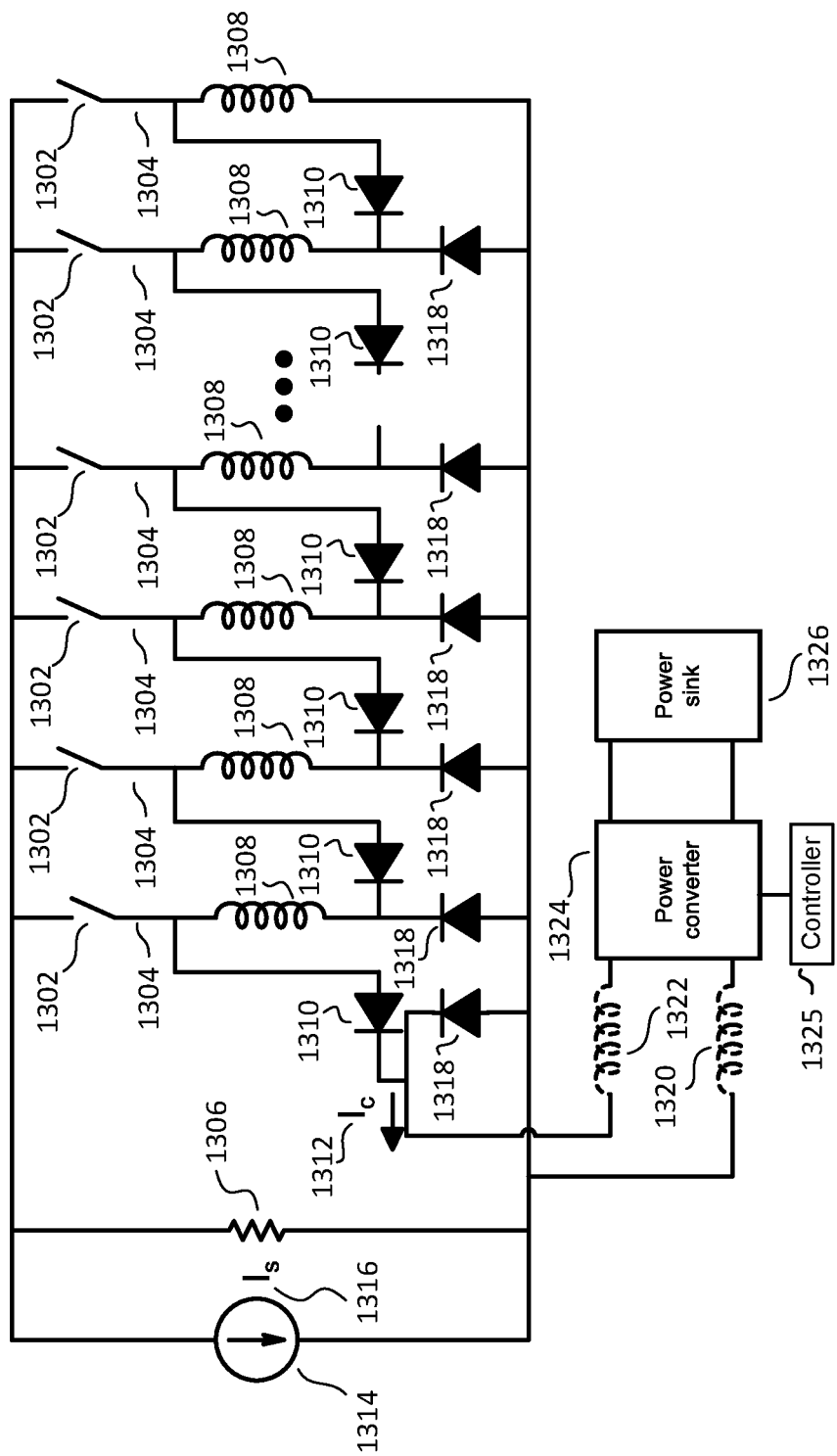
FIG. 13 illustrates an example implementation of current clamps with power recovery in a parallel switch circuit according to one embodiment of the present disclosure.

FIG. 13 shows an implementation of current clamps with power recovery in a parallel switch circuit according to one embodiment of the present disclosure. In FIG. 13 several switches 1302 are connected in parallel. Each switch is associated with a protected branch 1304. A rectifier—in this case a single diode 1310—connects the protected branch 1304 to a diode 1318 through which current can flow without restriction when the switches 1302 are closed if the current in diodes 1310 remains net-positive from anode to cathode through diode 1310. During the time that the switches are open current flows in a loop consisting of inductors 1308 diodes 1310 inductor 1322 the power converter 1324 and inductor 1320. During this time that the switches are open power converter 1324 maintains the current in this loop at or below the desired clamping level by directing power to a power sink 1326. The power sink 1326 may be a DC rail, the current source 1314 supplying power to the circuit or the AC utility supply. When the switches close any one of the switches can draw current up to level which was flowing through the inductors 1308 just prior to the switch closing through diode 1310 and 1318 but as soon as the current in a particular switch exceeds this level, the net anode to cathode current of the diode 1310 just left of the particular switch in FIG. 13 drops to zero and any further current increase through the particular switch is forced to go through the inductor 1308 in series with the particular switch. With inductor 1308 suitably large this dramatically inhibits the ability of the current in the particular switch from increasing much above the level of current in the inductor at the moment that the switch closed.

Figure 14:
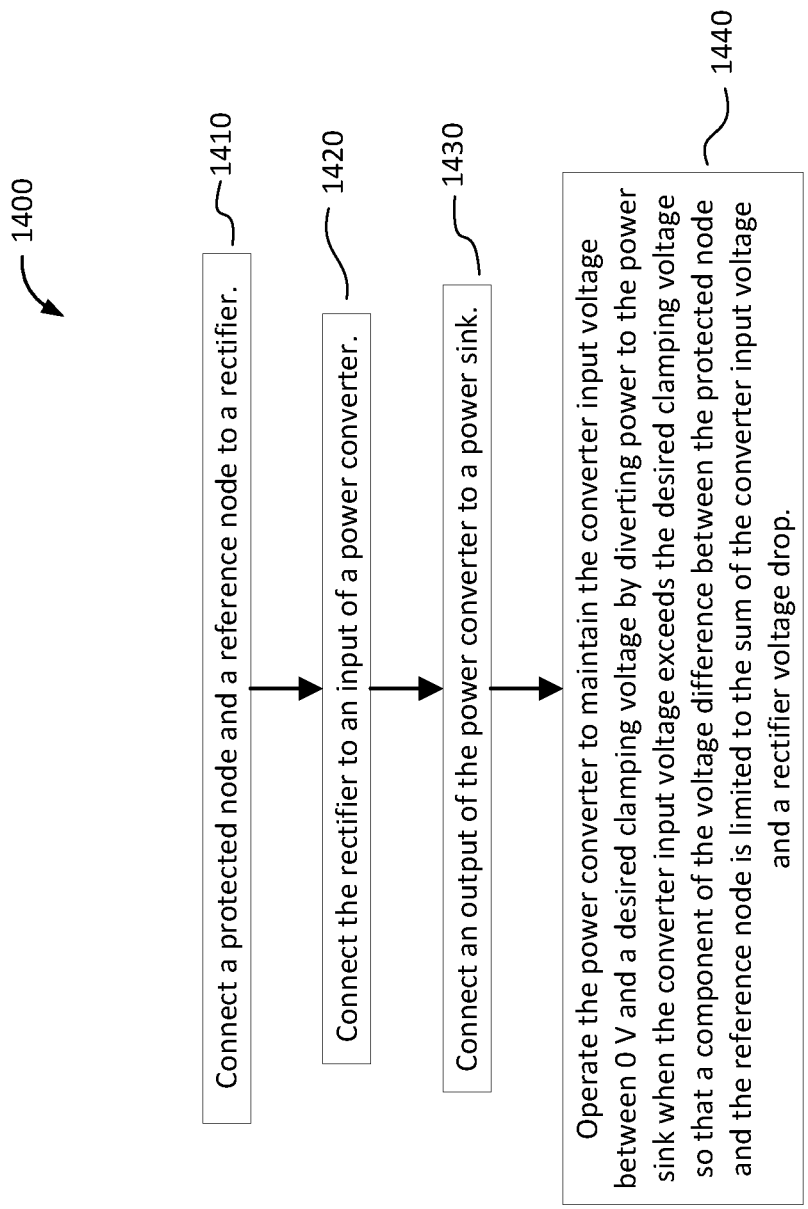
FIG. 14 depicts a flowchart for an example method embodiment of the disclosure.

FIG. 14 depicts a flowchart for an example method 1400, in another embodiment of the present disclosure. Method 1400 includes connecting a protected node and a reference node to a rectifier (1410). Method 1400 further includes connecting the rectifier to an input of a power converter (1420). Method 1400 further includes connecting an output of the power converter to a power sink (1430). Method 1400 further includes operating the power converter to maintain the converter input voltage between zero volts (0 V) and a desired clamping voltage by diverting power to the power sink when the converter input voltage exceeds the desired clamping voltage, so that a component of the voltage difference between the protected node and the reference node is limited to the sum of the converter input voltage and a rectifier voltage drop (1440).

Figure 15:
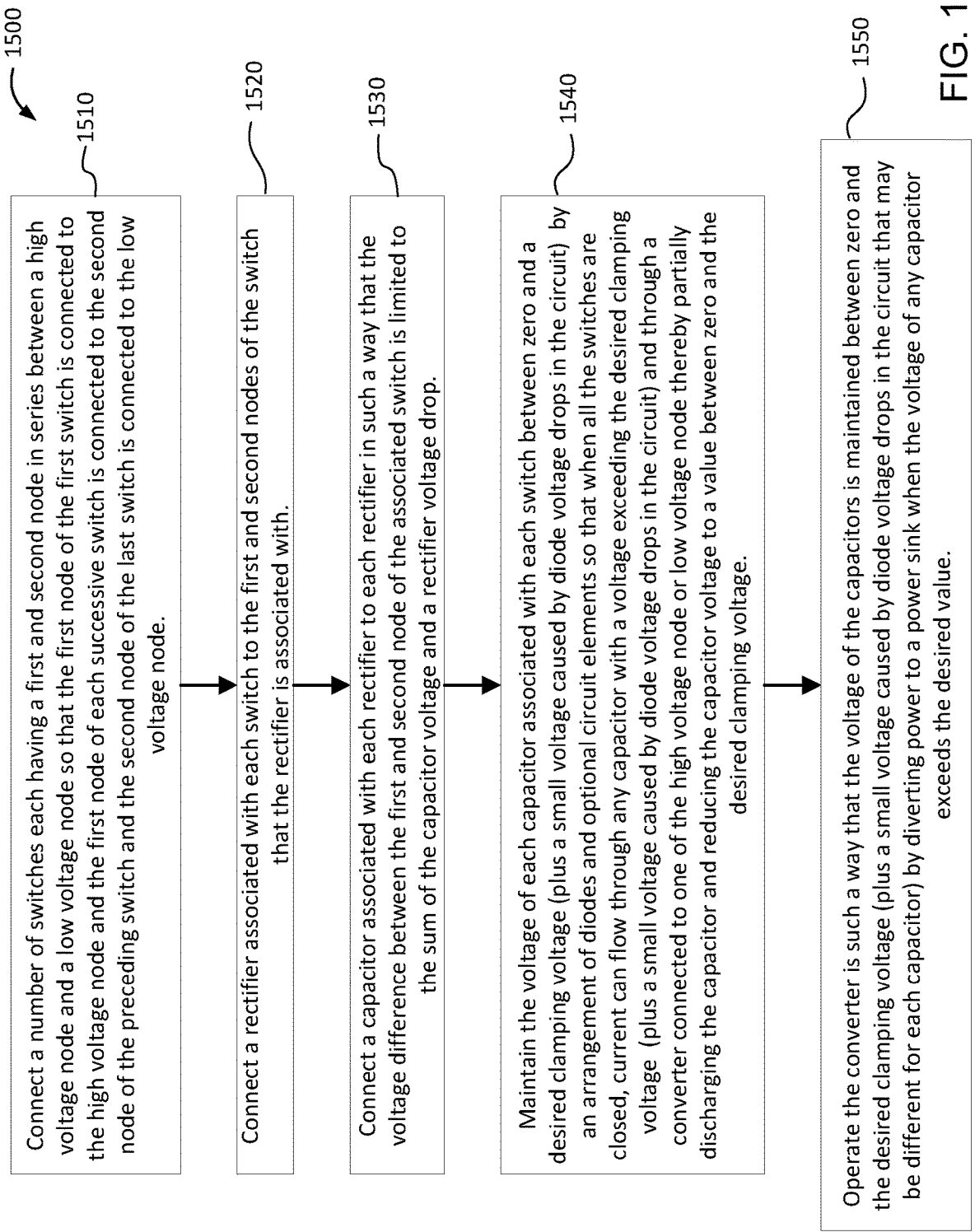
FIG. 15 depicts a flowchart for an example method embodiment of the disclosure.

FIG. 15 depicts a flowchart for an example method 1500, in another embodiment of the present disclosure. Method 1500 includes connecting a number of switches each having a first and second node in series between a high voltage node and a low voltage node so that the first node of the first switch is connected to the high voltage node and the first node of each successive switch is connected to the second node of the preceding switch and the second node of the last switch is connected to the low voltage node (1510). Method 1500 further includes connecting a rectifier associated with each switch to the first and second nodes of the switch that the rectifier is associated with (1520). Method 1500 further includes connecting a capacitor associated with each rectifier to each rectifier in such a way that the voltage difference between the first and second node of the associated switch is limited to the sum of the capacitor voltage and a rectifier voltage drop (1530). Method 1500 further includes maintaining the voltage of each capacitor associated with each switch between zero and a desired clamping voltage (plus a small voltage caused by diode voltage drops in the circuit) by an arrangement of diodes and optional circuit elements so that when all the switches are closed, current can flow through any capacitor with a voltage exceeding the desired clamping voltage (plus a small voltage caused by diode voltage drops in the circuit) and through a converter connected to one of the high voltage node or low voltage node thereby partially discharging the capacitor and reducing the capacitor voltage to a value between zero and the desired clamping voltage (1540). Method 1500 further includes operating the converter is such a way that the voltage of the capacitors is maintained between zero and the desired clamping voltage (plus a small voltage caused by diode voltage drops in the circuit that may be different for each capacitor) by diverting power to a power sink when the voltage of any capacitor exceeds the desired value (1550).

Figure 16:
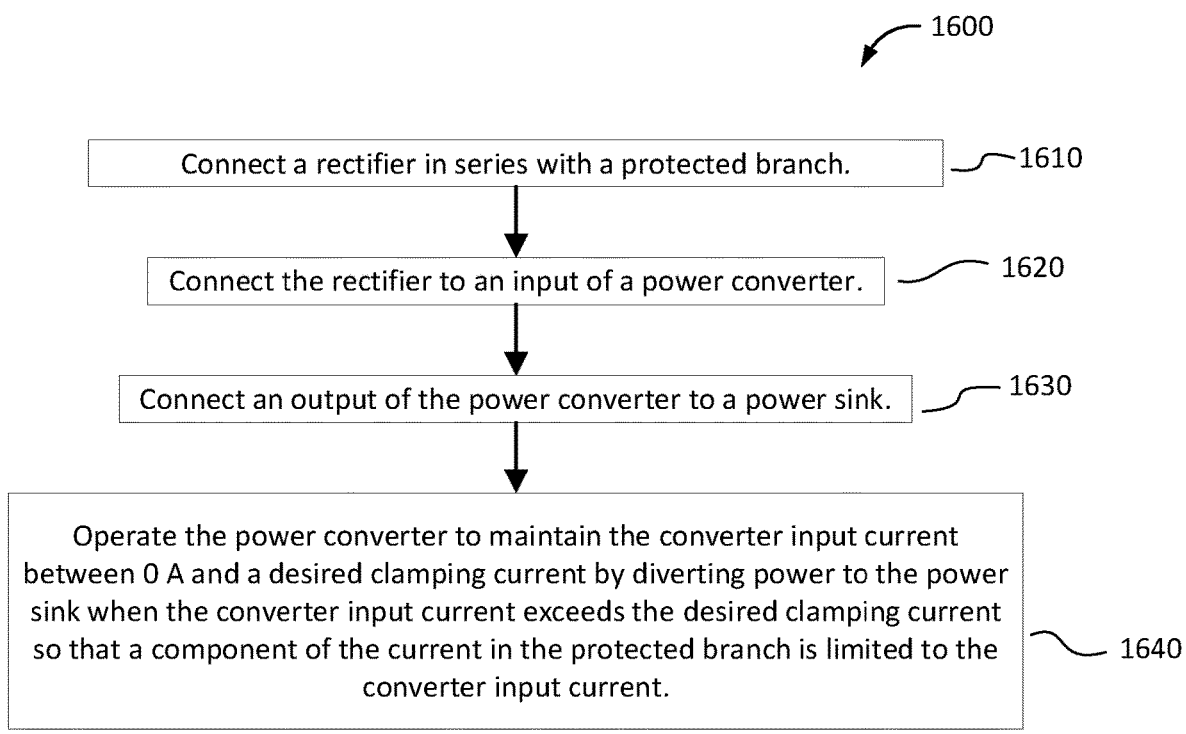
FIG. 16 depicts a flowchart for an example method embodiment of the disclosure.

FIG. 16 depicts a flowchart for an example method 1600, in another embodiment of the present disclosure. Method 1600 includes connecting a rectifier in series with a protected branch (1610). Method 1600 further includes connecting the rectifier to an input of a power converter (1620). Method 1600 further includes connecting an output of the power converter to a power sink (1630). Method 1600 further includes operating the power converter to maintain the converter input current between zero amps (0 Å) and a desired clamping current by diverting power to the power sink when the converter input current exceeds the desired clamping current so that a component of the current in the protected branch is limited to the converter input current (1640).

Figure 17:
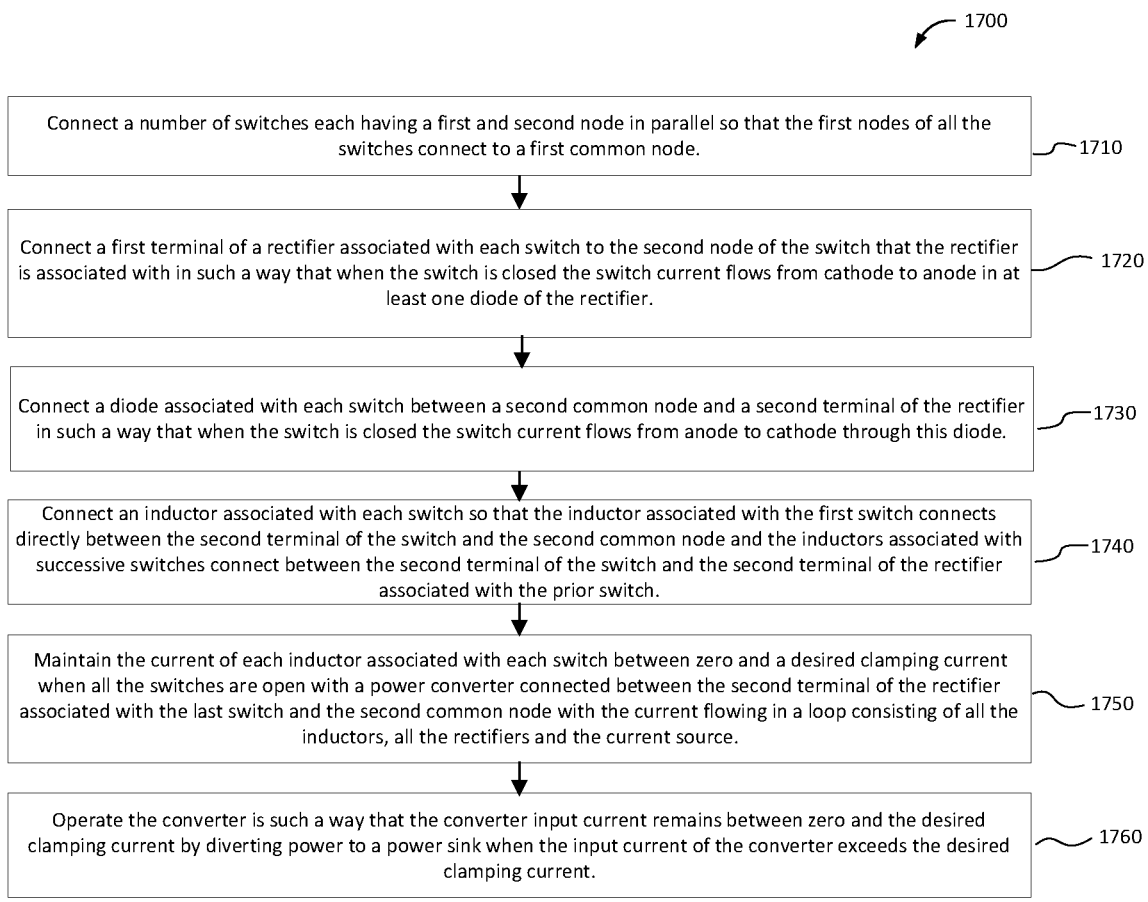
FIG. 17 depicts a flowchart for an example method embodiment of the disclosure.

FIG. 17 depicts a flowchart for an example method 1700, in another embodiment of the present disclosure. Method 1700 includes connecting a number of switches each having a first and second node in parallel so that the first nodes of all the switches connect to a first common node (1710). Method 1700 further includes connecting a first terminal of a rectifier associated with each switch to the second node of the switch that the rectifier is associated with in such a way that when the switch is closed the switch current flows from cathode to anode in at least one diode of the rectifier (1720). Method 1700 further includes connecting a diode associated with each switch between a second common node and a second terminal of the rectifier in such a way that when the switch is closed the switch current flows from anode to cathode through this diode (1730). Method 1700 further includes connecting an inductor associated with each switch so that the inductor associated with the first switch connects directly between the second terminal of the switch and the second common node and the inductors associated with successive switches connect between the second terminal of the switch and the second terminal of the rectifier associated with the prior switch (1740). Method 1700 further includes maintaining the current of each inductor associated with each switch between zero and a desired clamping current when all the switches are open with a power converter connected between the second terminal of the rectifier associated with the last switch and the second common node with the current flowing in a loop consisting of all the inductors, all the rectifiers and the current source (1750). Method 1700 further includes operating the converter is such a way that the converter input current remains between zero and the desired clamping current by diverting power to a power sink when the input current of the converter exceeds the desired clamping current (1760).

Figure 18:
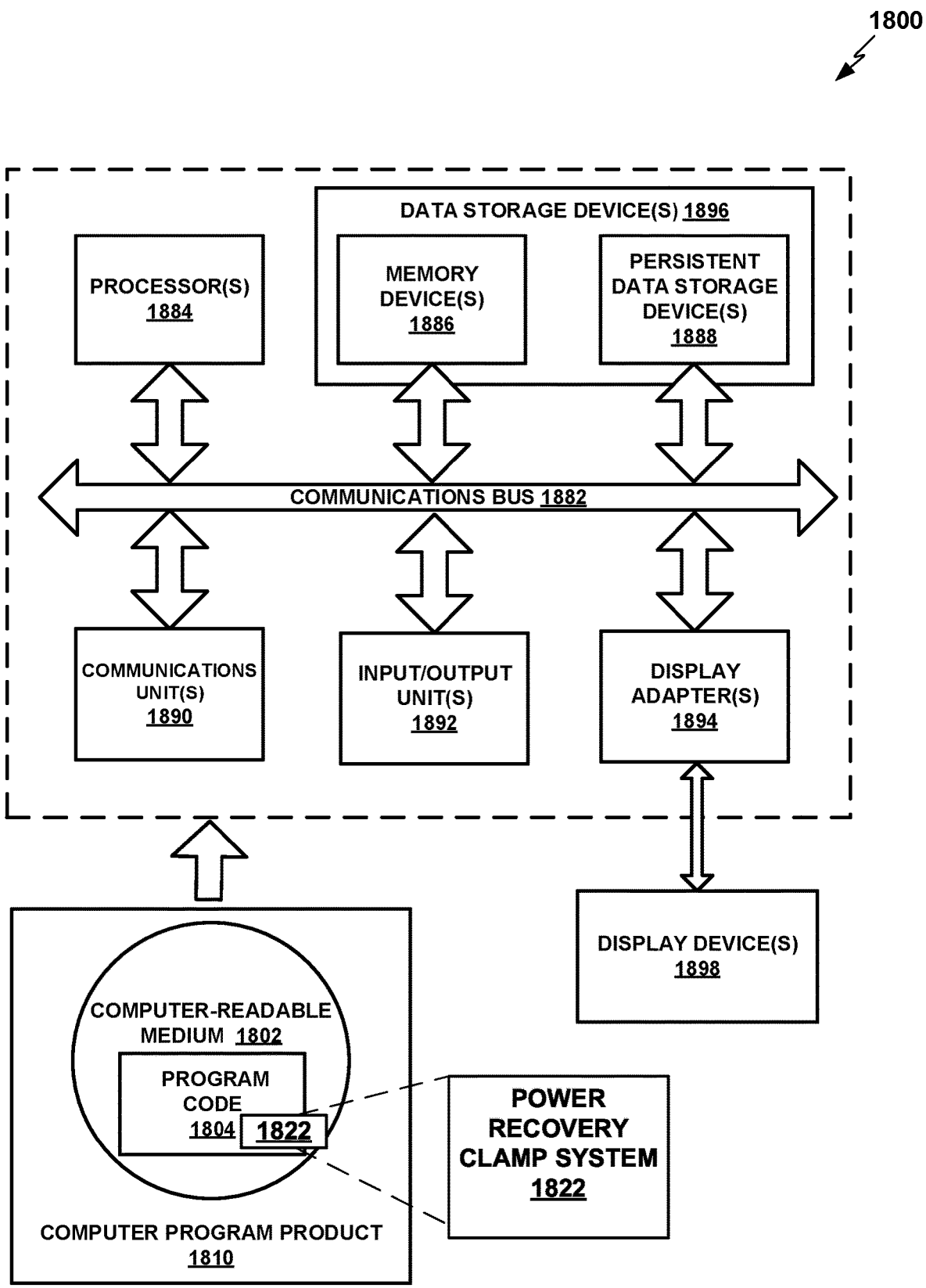
FIG. 18 depicts a block diagram of an example computing system that may control systems and execute methods in some embodiments of the disclosure.

FIG. 18 depicts a block diagram of an example computing system 1800 that may embody, control, or execute any of the various embodiments of voltage clamps, current clamps, generators, matching networks, and other systems, methods, and apparatus disclosed herein, in various embodiments of this disclosure. For example, computing system 1800 may serve as an embodiment of controller 412, controller 450, controller 468, controller 1212, controller 1250, or controller 1268 as depicted in FIGS. 4A, 4B, 12A, and 12B, respectively, and as described above with reference thereto. As further examples, computing system 1800 may perform, execute, or embody any of methods 1400, 1500, 1600, or 1700 as depicted in FIGS. 14, 15, 16, and 17 respectively, and as described above with reference thereto. Computing device 1800 may be a server such as a web server or an application server. Computing device 1800 may also be any server for providing a power recovery clamp application in various examples, including a virtual server that may be run from or incorporate any number of computing devices. A computing device may operate as all or part of a real or virtual server, and may be or incorporate a workstation, server, mainframe computer, notebook or laptop computer, desktop computer, tablet, smartphone, or other programmable data processing apparatus of any kind. Other implementations of a computing device 1800 may include a computer having capabilities or formats other than or beyond those described herein.

In the illustrative example of FIG. 18, computing device 1800 includes communications bus 1882, which provides communications between one or more processor unit 1884, one or more memory device(s) 1886, one or more persistent data storage device(s) 1888, one or more communications unit(s) 1890, and one or more input/output (I/O) unit(s) 1892. Communications bus 1882 may include a dedicated system bus, a general system bus, multiple buses arranged in hierarchical form, any other type of bus, bus network, switch fabric, or other interconnection technology. Communications bus 1882 supports transfer of data, commands, and other information between various subsystems of computing device 1800.

Processor unit 1884 may be a programmable central processing unit (CPU) configured for executing programmed instructions stored in memory 1886. In another illustrative example, processor unit 1884 may be implemented using one or more heterogeneous processor systems in which a main processor is present with secondary processors on a single chip. In another illustrative example, processor unit 1884 may be a symmetric multi-processor system containing multiple processors of the same type. Processor unit 1884 may be a reduced instruction set computing (RISC) microprocessor, an x86 compatible processor, or any other suitable processor. In various examples, processor unit 1884 may include a multi-core processor, for example. Processor unit 1884 may include multiple processing chips on one die, and/or multiple dies on one package or substrate, for example. Processor unit 1884 may also include one or more levels of integrated cache memory, for example. In various examples, processor unit 1884 may comprise one or more CPUs distributed across one or more locations.

Data storage 1896 includes one or more memory device(s) 1886 and one or more persistent data storage device(s) 1888, which are in communication with processor unit 1884 through communications bus 1882. Memory 1886 may include one or more random access semiconductor memory (RAM) devices for storing application data, i.e., computer program data, for processing. While memory 1886 is depicted as a single monolithic block, in various examples, memory 1886 may be arranged in a hierarchy of caches and in other memory devices, in a single physical location, or distributed across a plurality of physical systems in various forms. While memory 1886 is depicted physically separated from processor unit 1884 and other elements of computing device 1800, memory 1886 may refer equivalently to any intermediate or cache memory at any location throughout computing device 1800, including cache memory proximate to or integrated with processor unit 1884 or individual cores of processor unit 1884.

Persistent data storage 1888 may include one or more hard disc drives, solid state drives, flash drives, rewritable optical disc drives, magnetic tape drives, or any combination of these or other data storage media. Persistent data storage 1888 may store computer-executable instructions or computer-readable program code for an operating system, application files comprising program code, data structures or data files, and any other type of data. These computer-executable instructions may be loaded from persistent data storage 1888 into memory 1886 to be read and executed by processor unit 1884 or other processors. Data storage 1896 may also include any other hardware elements capable of storing information, such as, for example and without limitation, data, program code in functional form, and/or other suitable information, either on a temporary basis and/or a permanent basis.

Persistent data storage 1888 and memory 1886 are examples of physical, tangible, non-transitory computer-readable data storage devices. Data storage 1896 may include any of various forms of volatile memory that may require being periodically electrically refreshed to maintain data in memory, while those skilled in the art will recognize that this also constitutes an example of a physical, tangible, non-transitory computer-readable data storage device. Executable instructions may be stored on a non-transitory medium when program code is loaded, stored, relayed, buffered, or cached on a non-transitory physical medium or device, including if only for only a short duration or only in a volatile memory format.

Processor unit 1884 can also be suitably programmed to read, load, and execute computer-executable instructions or computer-readable program code for a power recovery clamp system 1822, as described in greater detail above. This program code may be stored on memory 1886, persistent data storage 1888, or elsewhere in computing device 1800. This program code may also take the form of program code 1804 stored on computer-readable medium 1802 comprised in computer program product 1810, and may be transferred or communicated, through any of a variety of local or remote means, from computer program product 1810 to computing device 1800 to be enabled to be executed by processor unit 1884, as further explained below.

The operating system may provide functions such as device interface management, memory management, and multiple task management. The operating system can be a Unix-based operating system, a non-Unix based operating system, a network operating system, a real-time operating system (RTOS), or any other suitable operating system. Processor unit 1884 can be suitably programmed to read, load, and execute instructions of the operating system.

Communications unit 1890, in this example, provides for communications with other computing or communications systems or devices. Communications unit 1890 may provide communications through the use of physical and/or wireless communications links. Communications unit 1890 may include a network interface card for interfacing with a local area network (LAN), an Ethernet adapter, a Token Ring adapter, a modem for connecting to a transmission system such as a telephone line, or any other type of communication interface. Communications unit 1890 may be used for operationally connecting many types of peripheral computing devices to computing device 1800, such as printers, bus adapters, and other computers. Communications unit 1890 may be implemented as an expansion card or be built into a motherboard, for example.

The input/output unit 1892 can support devices suited for input and output of data with other devices that may be connected to computing device 1800, such as keyboard, a mouse or other pointer, a touchscreen interface, an interface for a printer or any other peripheral device, a removable magnetic or optical disc drive (including CD-ROM, DVD-ROM, or Blu-Ray), a universal serial bus (USB) receptacle, or any other type of input and/or output device. Input/output unit 1892 may also include any type of interface for video output in any type of video output protocol and any type of monitor or other video display technology, in various examples. Some of these examples may overlap with each other, or with example components of communications unit 1890 or data storage 1896. Input/output unit 92 may also include appropriate device drivers for any type of external device, or such device drivers may reside elsewhere on computing device 1800 as appropriate.

Computing device 1800 also includes a display adapter 1894 in this illustrative example, which provides one or more connections for one or more display devices, such as display device 1898, which may include any of a variety of types of display devices. Some of these examples may overlap with example components of communications unit 1890 or input/output unit 1892. Input/output unit 1892 may also include appropriate device drivers for any type of external device, or such device drivers may reside elsewhere on computing device 1800 as appropriate. Display adapter 94 may include one or more video cards, one or more graphics processing units (GPUs), one or more video-capable connection ports, or any other type of data connector capable of communicating video data, in various examples. Display device 1898 may be any kind of video display device, such as a monitor, a television, or a projector, in various examples.

Input/output unit 1892 may include a drive, socket, or outlet for receiving computer program product 1810, which comprises a tangible, non-transitory computer-readable medium 1802 having computer program code 1804 stored thereon. For example, computer program product 1810 may be a CD-ROM, a DVD-ROM, a Blu-Ray disc, a magnetic disc, a USB stick, a flash drive, or an external hard disc drive, as illustrative examples, or any other suitable data storage technology.

Computer-readable medium 1802 may include any type of optical, magnetic, or other physical medium that physically encodes program code 1804 as a binary series of different physical states in each unit of memory that, when read by computing device 1800, induces a physical signal that is read by processor 1884 that corresponds to the physical states of the basic data storage elements of storage medium 1802, and that induces corresponding changes to the physical state of processor unit 1884. That physical program code signal may be modeled or conceptualized as computer-readable instructions at any of various levels of abstraction, such as a high-level programming language, assembly language, or machine language, but ultimately constitutes a series of electrical and/or magnetic interactions that physically induce a change in the physical state of processor unit 1884, thereby physically reconfiguring processor unit 1884 and causing or configuring processor unit 1884 to generate physical outputs that correspond to the computer-executable instructions, in a way that causes computing device 1800 to physically assume new capabilities that it did not have until its physical state was changed by loading the executable instructions comprised in program code 1804.

In some illustrative examples, program code 1804 may be downloaded over a network to data storage 1896 from another device or computer system for use within computing device 1800. Program code 1804 comprising computer-executable instructions may be communicated or transferred to computing device 1800 from computer-readable medium 1802 through a hard-line or wireless communications link to communications unit 1890 and/or through a connection to input/output unit 1892. Computer-readable medium 1802 comprising program code 1804 may be located at a separate or remote location from computing device 1800, and may be located anywhere, including at any remote geographical location anywhere in the world or in orbit, and may relay program code 1804 to computing device 1800 over any type of one or more communication links, such as the Internet and/or other packet data networks. The program code 1804 may be transmitted over a wireless Internet connection, or over a shorter-range direct wireless connection such as wireless LAN, Bluetooth™, Wi-Fi™, or an infrared connection, for example. Any other wireless or remote communication protocol may also be used in other implementations.

The communications link and/or the connection may include wired and/or wireless connections in various illustrative examples, and program code 1804 may be transmitted from a source computer-readable medium 1802 over non-tangible media, such as communications links or wireless transmissions containing the program code 1804. Program code 1804 may be more or less temporarily or durably stored on any number of intermediate tangible, physical computer-readable devices and media, such as any number of physical buffers, caches, main memory, or data storage components of servers, gateways, network nodes, mobility management entities, or other network assets, en route from its original source medium to computing device 1800.

Various example embodiments of this disclosure may be in the form of a system, a method, and/or a computer program product. The computer program product may include a computer readable storage medium (or media) having computer readable program instructions thereon for causing a processor to carry out aspects of embodiments of this disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including object-oriented programming languages such as C++ or Java; imperative programming languages, such as C; Lisp programming languages, such as Common Lisp, Racket, or Clojure; other functional programming languages, such as Haskell or Erlang; or multi-paradigm languages, such as Python or Rust. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider (ISP)). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of embodiments of this disclosure.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions, acts, or steps specified in the flowchart and/or block diagram block or blocks.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur in a different order than that noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, may also be implemented by special purpose hardware-based systems that perform the specified functions or acts or carry out combinations of special purpose hardware and computer instructions.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Figure 19:
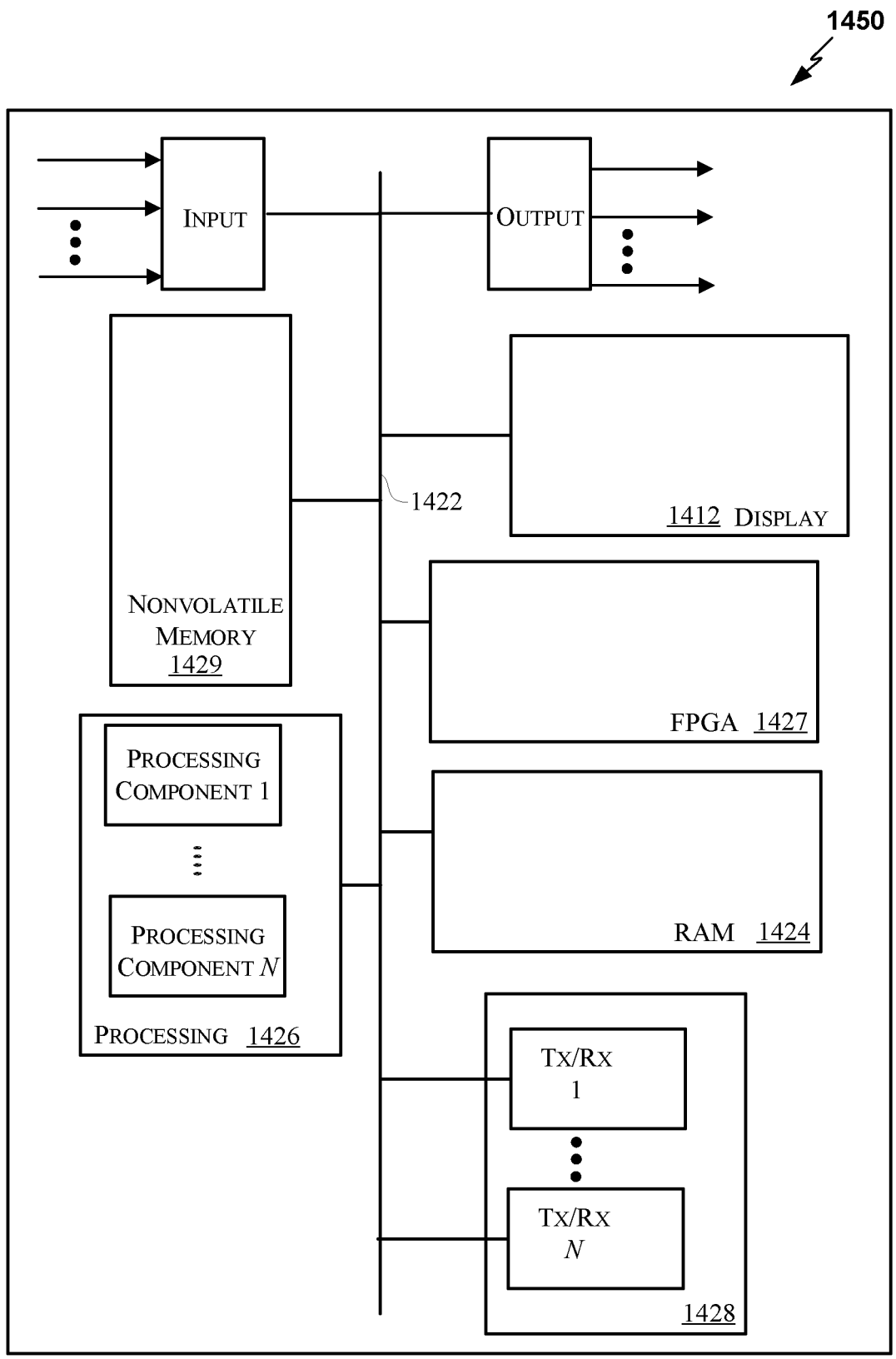
FIG. 19 depicts a block diagram of an example computing system that may control systems and execute methods in some embodiments of the disclosure.

FIG. 19 depicts a conceptual block diagram of example physical components that may perform, execute, or embody one or more aspects of various embodiments of voltage clamps, current clamps, generators, matching networks, and other systems, methods, and apparatus disclosed herein. As shown, in this embodiment a display 1412 and nonvolatile memory 1429 are coupled to a bus 1422 that is also coupled to random access memory ("RAM") 1424, a processing portion (which includes N processing components) 1426, a field programmable gate array (FPGA) 1427, and a transceiver component 1428 that includes N transceivers. Although the components depicted in FIG. 26 represent physical components, FIG. 26 is not intended to be a detailed hardware diagram; thus, many of the components depicted in FIG. 26 may be realized by common constructs or distributed among additional physical components. Moreover, it is contemplated that other existing and yet-to-be developed physical components and architectures may be utilized to implement the functional components described with reference to FIG. 26.

A display 1412 generally operates to provide a user interface for a user, and in several implementations, the display 1412 is realized by a touchscreen display. For example, display 1412 can be used to control and interact with the components described herein. In general, the non-volatile memory 1429 is non-transitory memory that functions to store (e.g., persistently store) data and machine readable (e.g., processor executable) code (including executable code that is associated with effectuating the methods described herein). In some embodiments, for example, the nonvolatile memory 1429 includes bootloader code, operating system code, file system code, and non-transitory processor-executable code to facilitate the execution of the methods described herein.

In many implementations, the nonvolatile memory 1429 is realized by flash memory (e.g., NAND or ONENAND memory), but it is contemplated that other memory types may be utilized as well. Although it may be possible to execute the code from the nonvolatile memory 1429, the executable code in the nonvolatile memory is typically loaded into RAM 1424 and executed by one or more of the N processing components in the processing portion 1426.

In operation, the N processing components in connection with RAM 1424 may generally operate to execute the instructions stored in nonvolatile memory 1429 to realize the functionality of the power recovery circuits described herein. For example, non-transitory processor-executable instructions to effectuate the methods described herein may be persistently stored in nonvolatile memory 1429 and executed by the N processing components in connection with RAM 1424. As one of ordinary skill in the art will appreciate, the processing portion 1426 may include a video processor, digital signal processor (DSP), graphics processing unit (GPU), and other processing components.

In addition, or in the alternative, the field programmable gate array (FPGA) 1427 may be configured to effectuate one or more aspects of the methodologies described herein. For example, non-transitory FPGA-configuration-instructions may be persistently stored in nonvolatile memory 1429 and accessed by the FPGA 1427 (e.g., during boot up) to configure the FPGA 1427.

The input component may operate to receive signals (e.g., from a voltage amplitude measurement circuit and/or the current amplitude measurement circuit associated with a controller such as controllers 162, 412, 450, 462, 1212, 1250, 1268 as described above) that are indicative of voltage and/or current. The output component generally operates to provide one or more analog or digital signals (e.g., to prompt drive signals to switch(es) in power converter 118, or other switches or circuitry of voltage clamp systems or current clamp systems as described herein) to effectuate operational aspects of a voltage clamp or current clamp with power recovery, or other system described herein.

The depicted transceiver component 1428 includes N transceiver chains, which may be used for communicating with external devices (e.g., external controllers) via wireless or wireline networks. Each of the N transceiver chains may represent a transceiver associated with a particular communication scheme (e.g., WiFi, Ethernet, Profibus, etc.).

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include a wide range of embodiments encompassing any such changes.

While the present disclosure has been described with reference to various embodiments, it will be understood that these embodiments are illustrative and that the scope of the disclosure is not limited to them. Many variations, modifications, and additions are possible within the scope of the embodiments of the disclosure. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A voltage clamp system comprising:
   a rectifier;
   a protected node, a reference node, and one or more internal nodes, coupled to the rectifier;
   a power converter, coupled to the rectifier via the one or more internal nodes; and
   one or more output nodes coupled to the power converter and configured to couple to a power sink,
   wherein the rectifier and the power converter are configured to output power via one or more output nodes coupled to the rectifier, and prevent a component of a voltage difference between the protected node and the reference node from rising above a clamping voltage.

2. The system of claim 1, wherein the rectifier and the power converter are further configured to limit an absolute value of the voltage difference between the protected node and the reference node.

3. The system of claim 1, wherein the rectifier and the power converter are further configured to limit an amplitude of a high frequency, AC, or RF component of the voltage difference between the protected node and the reference node.

4. The system of claim 1, wherein the rectifier and the power converter are further configured to limit a low frequency or DC component of the voltage difference between the protected node and the reference node.

5. The system of claim 1, further comprising:
   a frequency selective filter,
   wherein the system is further configured to determine the component of the voltage difference between the protected node and the reference node using the frequency selective filter.

6. The system of claim 1, wherein the rectifier and the power converter are further configured to limit a sum of an input voltage of the power converter and a voltage drop of the rectifier.

7. The system of claim 1, wherein the one or more internal nodes comprise a first and second internal node, and the system further comprises a capacitor, coupled between the first and second internal nodes.

8. The system of claim 1, wherein the one or more output nodes are further configured to couple to the power sink comprising an output of a DC power supply, and wherein the power converter comprises one of a buck converter, a boost converter, a buck-boost converter, a Ćuk converter, a flyback converter, an isolated half bridge converter, or an isolated full bridge converter.

9. The system of claim 1, wherein the one or more output nodes are further configured to couple to the power sink comprising an AC utility supply, and wherein the power converter comprises a grid-tie inverter.

10. The system of claim 1, wherein the protected node and the reference node are comprised in a radio frequency (RF) generator or an RF power amplifier, and wherein the one or more output nodes are further configured to couple to the power sink that comprises a DC bus supplying power to the RF generator or the RF power amplifier.

11. The system of claim 1, wherein the protected node and the reference node are part of an RF impedance matching network, and wherein the one or more output nodes are further configured to couple to the power sink that comprises an AC utility supply.

12. The system of claim 1, further comprising a protected device, wherein a first terminal of the protected device is connected to the protected node, and a second terminal of the protected device is connected to the reference node.

13. The system of claim 12, wherein the protected device comprises one or more of a bipolar junction transistor, a field effect transistor, a PIN diode, a semiconductor device, a capacitor, a switched capacitor bank comprising one or more series-connected capacitors and semiconductor switches connected in parallel, and
   wherein the protected device, the rectifier, and the first capacitor are packaged together.

14. The voltage clamp of claim 1, wherein the component of the voltage difference is one of the voltage difference, a negative of the voltage difference, and a magnitude of the voltage difference.

15. A method comprising:
- configuring a power converter, coupled to a rectifier via one or more internal nodes, to output power via one or more output nodes to a power sink; and
- configuring the power converter and the rectifier to prevent a component of a voltage difference between a protected node and a reference node coupled to the rectifier from rising above a clamping voltage.

16. The method of claim 15, further comprising configuring the rectifier and the power converter to limit one or more of an absolute value, a high frequency component, an AC component, an RF component, a low frequency component, or a DC component of the voltage difference between the protected node and the reference node.

17. The method of claim 15, wherein the component of the voltage difference is one of the voltage difference, a negative of the voltage difference, and a magnitude of the voltage difference.

18. A computing system comprising:
- one or more processing devices, one or more tangible computer-readable memory devices, and one or more tangible computer-readable data storage devices;
- program instructions, stored on the one or more data storage devices for execution by the one or more processing devices using the one or more memory devices, to configure a power converter, coupled to a rectifier via one or more internal nodes, to output power via one or more output nodes to a power sink; and
- program instructions, stored on the one or more data storage devices for execution by the one or more processing devices using the one or more memory devices, to configure the power converter and the rectifier to prevent a component of a voltage difference between a protected node and a reference node coupled to the rectifier from rising above a clamping voltage.

19. The computing system of claim 18, wherein the programming instructions further configure the rectifier and the power converter to limit one or more of an absolute value, a high frequency component, an AC component, an RF component, a low frequency component, or a DC component of the voltage difference between the protected node and the reference node.

20. The computing system of claim 18, wherein the component of the voltage difference is one of the voltage difference, a negative of the voltage difference, and a magnitude of the voltage difference.

\* \* \* \* \*